US012641806B2

(12) United States Patent
Nian et al.

(10) Patent No.: US 12,641,806 B2
(45) Date of Patent: May 26, 2026

(54) CAPACITOR STRUCTURE INCLUDING A BUFFER LAYER AND METHODS OF FORMATION

(71) Applicant: Taiwan Semiconductor Manufacturing Company, Ltd., Hsinchu (TW)

(72) Inventors: Jun-Nan Nian, Tainan (TW); Jian-Shin Tsai, Tainan (TW); Yao-Hsiang Liang, Shinchu (TW); Ming-Ching Chung, Tainan (TW); Chen-Ying Chuan, Tainan (TW)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 418 days.

(21) Appl. No.: 18/305,088

(22) Filed: Apr. 21, 2023

(65) Prior Publication Data

US 2024/0355870 A1    Oct. 24, 2024

(51) Int. Cl.
H10B 12/00 (2023.01)
H10D 1/68 (2025.01)
H10W 20/40 (2026.01)

(52) U.S. Cl.
CPC ............. H10D 1/696 (2025.01); H10D 1/692 (2025.01); H10W 20/496 (2026.01)

(58) Field of Classification Search
CPC .......... H10D 1/696; H10D 1/692; H10D 1/68; H10B 12/00; H01L 21/02312; H01L 21/02323; H01L 23/5223; H10W 20/496
See application file for complete search history.

(56) References Cited

U.S. PATENT DOCUMENTS

| | | | |
|---|---|---|---|
| 6,551,896 B2 * | 4/2003 | Hosoda | H10D 1/68 |
| | | | 257/E29.345 |
| 2005/0196915 A1 * | 9/2005 | Jeong | H10D 1/68 |
| | | | 438/238 |
| 2013/0200490 A1 * | 8/2013 | Lin | H10D 1/68 |
| | | | 257/532 |
| 2015/0171161 A1 * | 6/2015 | Liang | H10D 1/696 |
| | | | 257/532 |
| 2015/0171207 A1 * | 6/2015 | Liang | H01L 23/5223 |
| | | | 257/296 |
| 2016/0133691 A1 | 5/2016 | Phatak et al. | |
| 2018/0240800 A1 * | 8/2018 | Ahn | H10B 12/34 |
| 2019/0229053 A1 * | 7/2019 | Hung | H10D 86/85 |

* cited by examiner

*Primary Examiner* — Omar F Mojaddedi
(74) *Attorney, Agent, or Firm* — Harrity & Harrity, LLP

(57) ABSTRACT

A buffer layer may be included between a first conductive electrode layer and an insulator layer, and/or between a second conductive electrode layer and the insulator layer of a capacitor structure to reduce lattice mismatching in the capacitor structure. The buffer layer(s) include a combination of materials that promote lattice matching between the insulator layer and one or more of the conductive electrode layers. This reduces the likelihood of formation of structural defects in the capacitor structure relative to another capacitor structure that does not include the buffer layers.

20 Claims, 30 Drawing Sheets

400

260

222

220

400

260

276
266
302b
264
302a
262
222
220

400

260

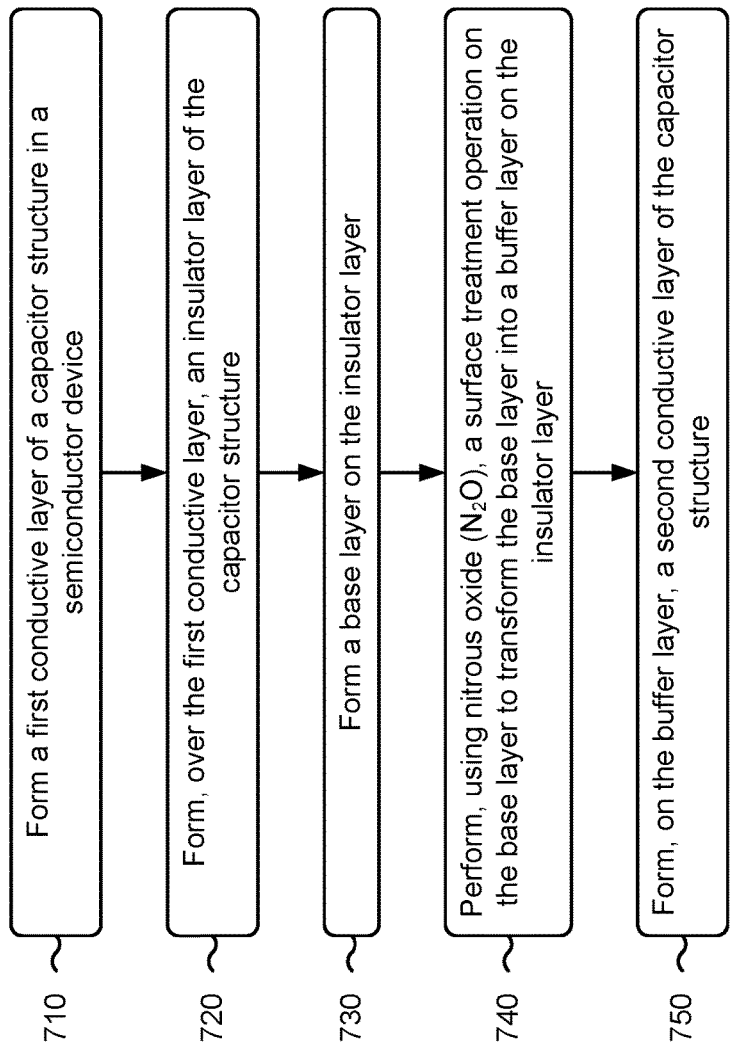

710   Form a first conductive layer of a capacitor structure in a semiconductor device 720   Form, over the first conductive layer, an insulator layer of the capacitor structure 730   Form a base layer on the insulator layer 740   Perform, using nitrous oxide (N₂O), a surface treatment operation on the base layer to transform the base layer into a buffer layer on the insulator layer 750   Form, on the buffer layer, a second conductive layer of the capacitor structure

CAPACITOR STRUCTURE INCLUDING A BUFFER LAYER AND METHODS OF FORMATION

BACKGROUND

A semiconductor device may include one or more capacitor structures in a back end of line (BEOL) region of the image sensor device. A capacitor structure may perform and/or support one or more functions in the semiconductor, such as charge storage, analog to digital (A/D) conversion, circuit decoupling, and/or another function.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIG. 7 is a flowchart of an example process associated with forming a capacitor structure including a buffer layer.

DETAILED DESCRIPTION

Figure 1A:
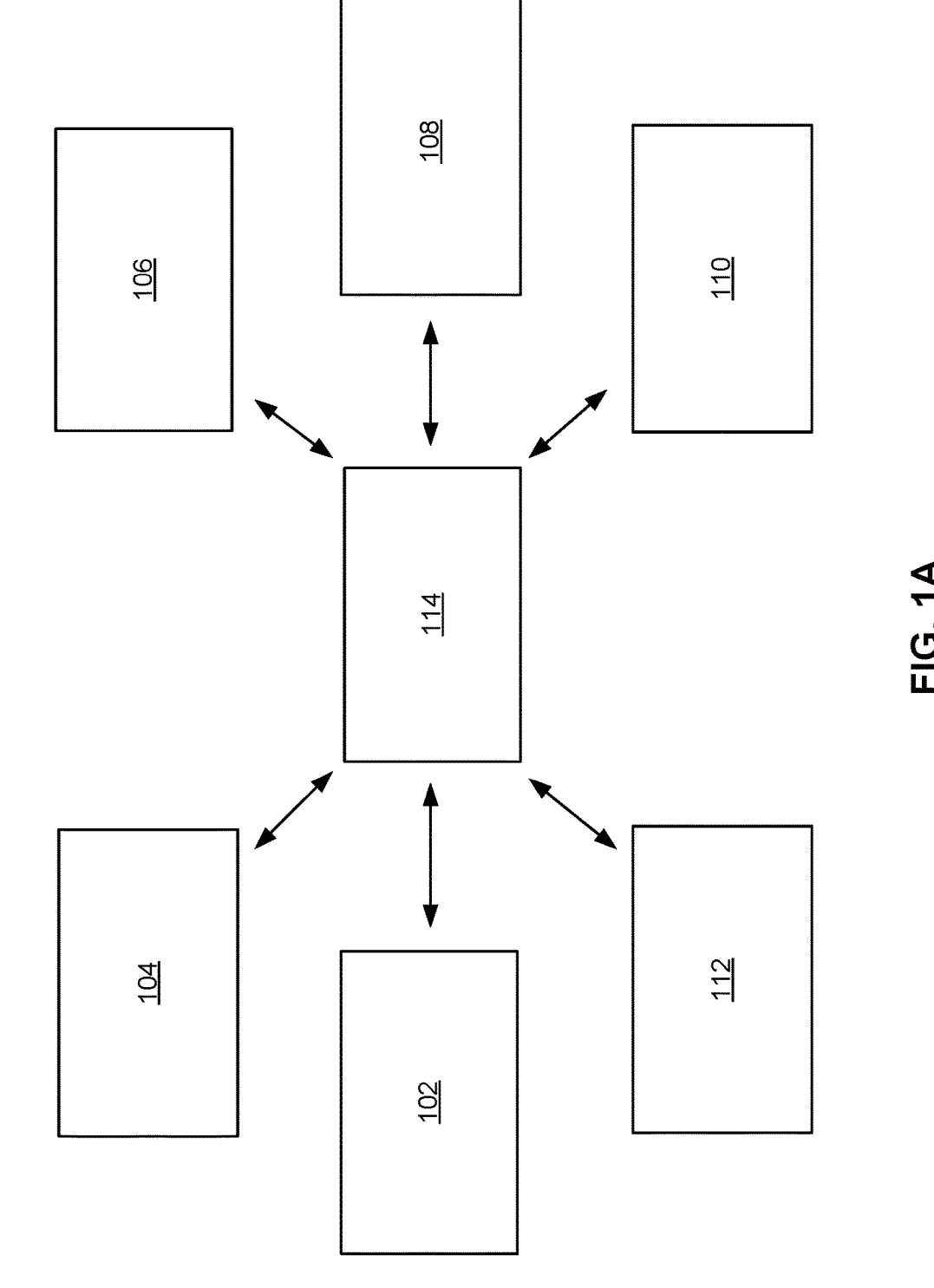
FIGS. 1A and 1B are diagrams of an example environment in which systems and/or methods described herein may be implemented.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

A capacitor structure may include a metal-insulator-metal (MIM) structure in which an insulator layer is sandwiched between two conductive electrode layers. The insulator layer may be formed on a first conductive electrode layer (e.g., a capacitor bottom metal (CBM) layer), and a second conductive layer (e.g., a capacitor top metal (CTM) layer) may be formed on the insulator layer.

In some cases, structural defects such as cracking may occur in a capacitor structure due to a lattice mismatch between the material(s) of the insulator layer and the material(s) of the conductive electrode layers of the capacitor structure. The structural defects may result in reduced performance for the capacitor structure and/or failure of the capacitor structure. Thus, the structural defects caused by lattice mismatches in capacitor structures in a semiconductor device may result in an increased defect rate in the semiconductor device, failure of the semiconductor device, and/or reduced yield of semiconductor devices that include capacitor structures, among other examples.

In some implementations described herein, a capacitor structure may include a metal-insulator-metal (MIM) structure in which an insulator layer is sandwiched between a first conductive electrode layer and a second conductive electrode layer. To reduce lattice mismatching between the material(s) of the insulator layer and the materials of the conductive electrode layers, buffer layers may be included between the first conductive electrode layer and the insulator layer, and between the second conductive electrode layer and the insulator layer. The buffer layers each include a combination of materials that promote lattice matching between the insulator layer and the conductive electrode layers. For example, a buffer layer may include a first material that approximately matches a lattice size of a conductive electrode layer, and a second material that approximately matches a lattice size of the insulator layer.

In this way, the buffer layers promote lattice matching between the insulator layer and the conductive electrode layers. This reduces the likelihood of formation of structural defects in the capacitor structure relative to another capacitor structure that does not include the buffer layers. This may increase performance for the capacitor structure and/or reduce the likelihood of failure of the capacitor structure. Moreover, this may reduce the defect rate in a semiconductor device that includes capacitor structures having buffer layers, may reduce the likelihood of failure of the semiconductor device, and/or may increase the yield of semiconductor devices that include capacitor structures having the buffer layers, among other examples.

Figure 1B:
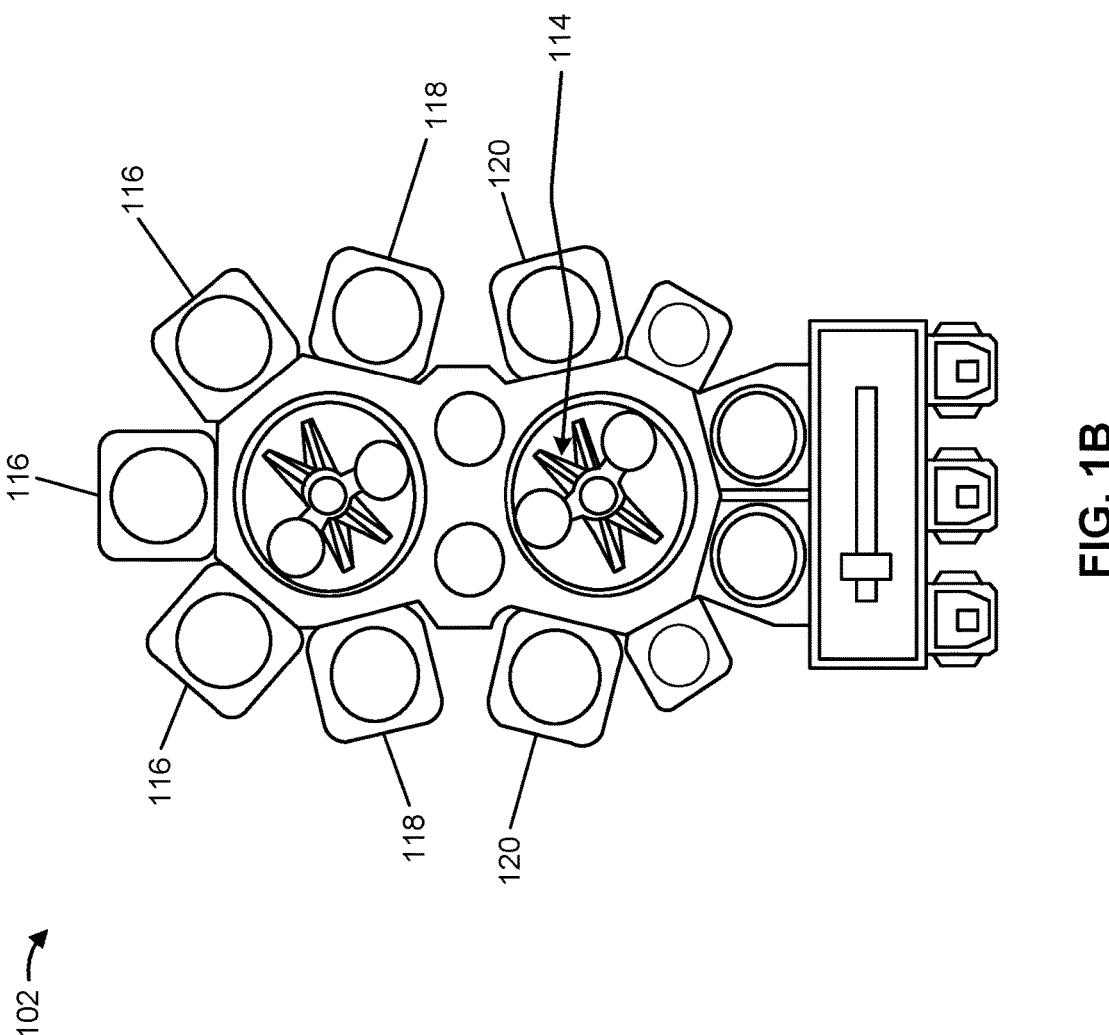

FIGS. 1A and 1B are diagrams of an example environment 100 in which systems and/or methods described herein may be implemented. As shown in FIG. 1A, the environment 100 may include a plurality of semiconductor processing tools 102-112 and a wafer/die transport tool 114. The plurality of semiconductor processing tools 102-112 may include a deposition tool 102, an exposure tool 104, a developer tool 106, an etch tool 108, a planarization tool 110, a plating tool 112, and/or another type of semiconductor processing tool. The tools included in example environment 100 may be included in a semiconductor clean room, a semiconductor foundry, a semiconductor processing facility, and/or manufacturing facility, among other examples.

The deposition tool 102 is a semiconductor processing tool that includes a semiconductor processing chamber and one or more devices capable of depositing various types of materials onto a substrate. In some implementations, the deposition tool 102 includes a spin coating tool that is capable of depositing a photoresist layer on a substrate such as a wafer. In some implementations, the deposition tool 102 includes a chemical vapor deposition (CVD) tool such as a plasma-enhanced CVD (PECVD) tool, a low pressure CVD (LPCVD) tool, a high-density plasma CVD (HDP-CVD) tool, a sub-atmospheric CVD (SACVD) tool, an atomic layer deposition (ALD) tool, a plasma-enhanced atomic layer deposition (PEALD) tool, or another type of CVD tool. In some implementations, the deposition tool 102 includes a physical vapor deposition (PVD) tool, such as a sputtering tool or another type of PVD tool. In some implementations, the example environment 100 includes a plurality of types of deposition tools 102.

The exposure tool 104 is a semiconductor processing tool that is capable of exposing a photoresist layer to a radiation source, such as an ultraviolet light (UV) source (e.g., a deep UV light source, an extreme UV light (EUV) source, and/or the like), an x-ray source, an electron beam (e-beam) source, and/or the like. The exposure tool 104 may expose a photoresist layer to the radiation source to transfer a pattern from a photomask to the photoresist layer. The pattern may include one or more semiconductor device layer patterns for forming one or more semiconductor devices, may include a pattern for forming one or more structures of a semiconductor device, may include a pattern for etching various portions of a semiconductor device, and/or the like. In some implementations, the exposure tool 104 includes a scanner, a stepper, or a similar type of exposure tool.

The developer tool 106 is a semiconductor processing tool that is capable of developing a photoresist layer that has been exposed to a radiation source to develop a pattern transferred to the photoresist layer from the exposure tool 104. In some implementations, the developer tool 106 develops a pattern by removing unexposed portions of a photoresist layer. In some implementations, the developer tool 106 develops a pattern by removing exposed portions of a photoresist layer. In some implementations, the developer tool 106 develops a pattern by dissolving exposed or unexposed portions of a photoresist layer through the use of a chemical developer.

The etch tool 108 is a semiconductor processing tool that is capable of etching various types of materials of a substrate, wafer, or semiconductor device. For example, the etch tool 108 may include a wet etch tool, a dry etch tool, and/or the like. In some implementations, the etch tool 108 includes a chamber that is filled with an etchant, and the substrate is placed in the chamber for a particular time period to remove particular amounts of one or more portions of the substrate. In some implementations, the etch tool 108 may etch one or more portions of the substrate using a plasma etch or a plasma-assisted etch, which may involve using an ionized gas to isotropically or directionally etch the one or more portions.

The planarization tool 110 is a semiconductor processing tool that is capable of polishing or planarizing various layers of a wafer or semiconductor device. For example, a planarization tool 110 may include a chemical mechanical planarization (CMP) tool and/or another type of planarization tool that polishes or planarizes a layer or surface of deposited or plated material. The planarization tool 110 may polish or planarize a surface of a semiconductor device with a combination of chemical and mechanical forces (e.g., chemical etching and free abrasive polishing). The planarization tool 110 may utilize an abrasive and corrosive chemical slurry in conjunction with a polishing pad and retaining ring (e.g., typically of a greater diameter than the semiconductor device). The polishing pad and the semiconductor device may be pressed together by a dynamic polishing head and held in place by the retaining ring. The dynamic polishing head may rotate with different axes of rotation to remove material and even out any irregular topography of the semiconductor device, making the semiconductor device flat or planar.

The plating tool 112 is a semiconductor processing tool that is capable of plating a substrate (e.g., a wafer, a semiconductor device, and/or the like) or a portion thereof with one or more metals. For example, the plating tool 112 may include a copper electroplating device, an aluminum electroplating device, a nickel electroplating device, a tin electroplating device, a compound material or alloy (e.g., tin-silver, tin-lead, and/or the like) electroplating device, and/or an electroplating device for one or more other types of conductive materials, metals, and/or similar types of materials.

The wafer/die transport tool 114 may be included in a cluster tool or another type of tool that includes a plurality of processing chambers, and may be configured to transport substrates and/or semiconductor devices between the plurality of processing chambers, to transport substrates and/or semiconductor devices between a processing chamber and a buffer area, to transport substrates and/or semiconductor devices between a processing chamber and an interface tool such as an equipment front end module (EFEM), and/or to transport substrates and/or semiconductor devices between a processing chamber and a transport carrier (e.g., a front opening unified pod (FOUP)), among other examples. In some implementations, a wafer/die transport tool 114 may be included in a multi-chamber (or cluster) deposition tool 102, which may include a pre-clean processing chamber (e.g., for cleaning or removing oxides, oxidation, and/or other types of contamination or byproducts from a substrate and/or semiconductor device) and a plurality of types of deposition processing chambers (e.g., processing chambers for depositing different types of materials, processing chambers for performing different types of deposition operations).

FIG. 1B illustrated a diagram of an example implementation of a deposition tool 102. The deposition tool 102 may include a cluster tool that includes a plurality of processing chambers. Different subsets of the processing chambers of the deposition tool 102 may be configured to perform different types of semiconductor processing operations. For example, the deposition tool 102 may include one or more first processing chambers 116 configured to perform a deposition operation, such as a CVD operation, an ALD operation, a PVD operation, an epitaxy operation, a PECVD operation, an LPCVD operation, an HDP-CVD operation, an SACVD, a PEALD operation, and/or another type of deposition operation. In some implementations, two or more of the first processing chambers 116 may be configured to deposit different materials.

As another example, the deposition tool 102 may include one or more second processing chamber 118 configured to perform a surface treatment operation. For example, a second processing chamber 118 may be configured to perform a surface treatment operation on a layer of a semiconductor device using nitrous oxide ($N_2O$) and/or another surface treatment chemical. As another example, the deposition tool 102 may include one or more second processing chambers 118 configured to perform a degas operation in which processing gasses and/or byproduct gasses are removed from the deposition tool 102 (e.g., in preparation for transferring semiconductor devices into and/or out of the deposition tool 102).

The deposition tool 102 may further include one or more wafer/die transport tool 114 to transport semiconductor devices between the processing chambers of the deposition tool 102. In some implementations, the environment within the deposition tool 102 is sealed and environmentally controlled to prevent or reduce the likelihood of contamination of semiconductor devices processed in the deposition tool 102. A wafer/die transport tool 114 of the deposition tool 102 may be configured to transfer a semiconductor device between processing chambers of the deposition tool 102 without exposing the semiconductor devices to the external environment outside of the deposition tool 102. In this way, the wafer/die transport tool 114 may transfer a semiconductor device from a first processing chamber 116 to a second processing chamber 118 "in-situ" (e.g., without breaking the vacuum in which the semiconductor device is located), and/or may transfer a semiconductor device from a second processing chamber 118 to a first processing chamber 116 "in-situ" (e.g., without breaking the vacuum in which the semiconductor device is located), among other examples.

In some implementations, one or more of the semiconductor processing tools 102-112 and/or the wafer/die transport tool 114 may perform one or more semiconductor processing operations described herein. For example, one or more of the semiconductor processing tools 102-112 and/or the wafer/die transport tool 114 may form a first conductive layer of a capacitor structure in a semiconductor device; may form, over the first conductive layer, an insulator layer of the capacitor structure; may form a base layer on the insulator layer; may perform, using nitrous oxide ($N_2O$), a surface treatment operation on the base layer to transform the base layer into a buffer layer on the insulator layer; and/or may form, on the buffer layer, a second conductive layer of the capacitor structure, among other examples. As another example, one or more of the semiconductor processing tools 102-112 and/or the wafer/die transport tool 114 may form the base layer in a first processing chamber 116 of the deposition tool 102; and may perform the surface treatment operation in a second processing chamber 118 of the deposition tool 102. As another example, one or more of the semiconductor processing tools 102-112 and/or the wafer/die transport tool 114 may transfer the semiconductor device from the first processing chamber 116 to the second processing chamber 118 without breaking a vacuum in which the semiconductor device is located. As another example, one or more of the semiconductor processing tools 102-112 and/or the wafer/die transport tool 114 may perform, using nitrous oxide ($N_2O$), another surface treatment operation on the first conductive layer to form another buffer layer on the first conductive layer. As another example, one or more of the semiconductor processing tools 102-112 and/or the wafer/die transport tool 114 may form the insulator layer on the other buffer layer. In some implementations, one or more of the semiconductor processing tools 102-112 and/or the wafer/die transport tool 114 may perform one or more semiconductor processing operations described herein, such as one or more semiconductor processing operations described in connection with FIGS. 4A-4U and/or 7, among other examples.

The number and arrangement of devices shown in FIGS. 1A and 1B are provided as one or more examples. In practice, there may be additional devices, fewer devices, different devices, or differently arranged devices than those shown in FIGS. 1A and 1B. Furthermore, two or more devices shown in FIGS. 1A and 1B may be implemented within a single device, or a single device shown in FIGS. 1A and 1B may be implemented as multiple, distributed devices. Additionally, or alternatively, a set of devices (e.g., one or more devices) of the example environment 100 may perform one or more functions described as being performed by another set of devices of the example environment 100.

Figure 2:
FIG. 2 is a diagram of a portion of an example semiconductor device described herein.

FIG. 2 is a diagram of a portion of an example semiconductor device 200 described herein. The semiconductor device 200 includes an example of a semiconductor device, such as a semiconductor memory device (e.g., a static random access memory (SRAM), a dynamic random access memory (DRAM)), an image sensor device (e.g., a complementary metal oxide semiconductor (CMOS) image sensor (CIS) device), a semiconductor logic device, a processor, an input/output device, or another type of semiconductor device that includes one or more transistors.

The semiconductor device 200 includes a substrate 202. In some implementations, the semiconductor device 200 includes a fin structure 204 that extends above the substrate 202. The semiconductor device 200 includes one or more stacked layers, including a dielectric layer 206, an etch stop layer (ESL) 208, a dielectric layer 210, an ESL 212, a dielectric layer 214, an ESL 216, a dielectric layer 218, an ESL 220, a dielectric layer 222, an ESL 224, and a dielectric layer 226, among other examples. The dielectric layers 206, 210, 214, 218, 222, and 226 are included to electrically isolate various structures of the semiconductor device 200. The dielectric layers 206, 210, 214, 218, 222, and 226 include a silicon nitride ($SiN_x$), an oxide (e.g., a silicon oxide ($SiO_x$) and/or another oxide material), and/or another type of dielectric material. The ESLs 208, 212, 216, 220, 224 includes a layer of material that is configured to permit various portions of the semiconductor device 200 (or the layers included therein) to be selectively etched or protected from etching to form one or more of the structures included in the semiconductor device 200.

As further shown in FIG. 2, the semiconductor device 200 includes a plurality of epitaxial (epi) regions 228 that are grown and/or otherwise formed on and/or around portions of the fin structure 204. The epitaxial regions 228 are formed by epitaxial growth. In some implementations, the epitaxial regions 228 are formed in recessed portions in the fin structure 204. The recessed portions may be formed by strained source drain (SSD) etching of the fin structure 204 and/or another type etching operation. The epitaxial regions 228 function as source or drain regions of the transistors included in the semiconductor device 200.

The epitaxial regions 228 are electrically connected to metal source or drain contacts 230 of the transistors included in the semiconductor device 200. The metal source or drain contacts (MDs or CAs) 230 include cobalt (Co), ruthenium (Ru), and/or another conductive or metal material. The transistors further include gates 232 (MGs), which are formed of a polysilicon material, a metal (e.g., tungsten (W) or another metal), and/or another type of conductive material. The metal source or drain contacts 230 and the gates 232 are electrically isolated by one or more sidewall spacers, including spacers 234 in each side of the metal source or drain contacts 230 and spacers 236 on each side of the gate 232. The spacers 234 and 236 include a silicon oxide ($SiO_x$), a silicon nitride ($Si_xN_y$), a silicon oxy carbide (SiOC), a silicon oxycarbonitride (SiOCN), and/or another suitable material. In some implementations, the spacers 234 are omitted from the sidewalls of the metal source or drain contacts 230.

As further shown in FIG. 2, the metal source or drain contacts 230 and the gates 232 are electrically connected to one or more types of interconnects. The interconnects electrically connect the transistors of the semiconductor device 200 and/or electrically connect the transistors to other areas and/or components of the semiconductor device 200. In some implementations, the interconnects electrically connect the transistors to a back end of line (BEOL) region of the semiconductor device 200.

The metal source or drain contacts 230 are electrically connected to source or drain interconnects 238 (e.g., source/drain vias or VDs). One or more of the gates 232 are electrically connected to gate interconnects 240 (e.g., gate vias or VGs). The interconnects 238 and 240 include a conductive material such as tungsten, cobalt, ruthenium, copper, and/or another type of conductive material. In some implementations, the gates 232 are electrically connected to the gate interconnects 240 by gate contacts 242 (CB or MP) to reduce contact resistance between the gates 232 and the gate interconnects 240. The gate contacts 242 include tungsten (W), cobalt (Co), ruthenium (Ru), titanium (Ti), aluminum (Al), copper (Cu) or gold (Au), among other examples of conductive materials.

As further shown in FIG. 2, the interconnects 238 and 240 are electrically connected to a plurality of BEOL layers, each including one or more metallization layers and/or vias. As an example, the interconnects 238 and 240 may be electrically connected to an M0 metallization layer that includes conductive structures 244 and 246. The M0 metallization layer is electrically connected to a V0 via layer that includes vias 248 and 250. The V0 via layer is electrically connected to an M1 metallization layer that includes conductive structures 252 and 254. In some implementations, the BEOL layers of the semiconductor device 200 includes additional metallization layers and/or vias that connect the semiconductor device 200 to a package. The BEOL region of the semiconductor device 200 may refer to the region of the semiconductor device 200 above the ESL 208, including the structures/layers 210-226 and 238-254.

As further shown in FIG. 2, the semiconductor device 200 may include one or more devices and/or structures in the BEOL region of the semiconductor device 200. For example, the semiconductor device 200 may include one or more capacitor structures 260 in the BEOL region of the semiconductor device 200. The capacitor structure(s) 260 may be included in one or more of the dielectric layers 210, 214, 218, 222, and/or 226 in the BEOL region of the semiconductor device 200.

A capacitor structure 260 may include a first conductive layer 262, an insulator layer 264, and a second conductive layer 266. The first conductive layer 262 and the second conductive layer 266 may correspond to the conductive electrode layers of the capacitor structure 260. The first conductive layer 262 may be referred to as the capacitor bottom metal (CBM) layer of the capacitor structure 260, and the second conductive layer 266 may be referred to as the capacitor top metal (CTM) layer of the capacitor structure 260. The insulator layer 264 may be located between the first conductive layer 262 and the second conductive layer 266. The first conductive layer 262, the insulator layer 264, and the second conductive layer 266 may form a metal-insulator-metal (MIM) structure of the capacitor structure 260.

The first conductive layer 262 and the second conductive layer 266 may each include one or more electrically conductive materials, such as one or more metals, one or more metal alloys, and/or one or more of another type of electrically conductive materials. Examples include tungsten (W), cobalt (Co), ruthenium (Ru), titanium (Ti), aluminum (Al), copper (Cu) or gold (Au), titanium nitride (TiN), and/or tantalum nitride (TaN), among other examples. The insulator layer 264 may include one or more electrically insulating and/or dielectric materials. In some implementations, the insulator layer 264 includes one or more dielectric materials having a relatively high dielectric constant (high-k), such as a dielectric constant greater relative to the dielectric constant of silicon dioxide ($SiO_2$). Examples include zirconium oxide ($ZrO_x$ such as $ZrO_2$), aluminum oxide ($Al_xO_y$ such as $Al_2O_3$), silicon nitride ($Si_xN_y$ such as $Si_3N_4$), yttrium oxide ($Y_xO_y$ such as $Y_2O_3$), lanthanum oxide ($La_xO_y$ such as $La_2O_3$), yttrium titanium oxide ($Y_xTiO_y$ such as $Y_2TiO_5$), hafnium oxide ($HfO_x$ such as $HfO_2$), and/or tantalum oxide ($Ta_xO_y$ such as $Ta_2O_5$), among other examples.

As described elsewhere herein, such as in connection with FIGS. 3A-3C, 4A-4U, and/or 7, the capacitor structure 260 may include one or more buffer layers to facilitate lattice matching between the first conductive layer 262 and the insulator layer 264, and/or to facilitate lattice matching between the second conductive layer 266 and the insulator layer 264. A buffer layer described herein may include a first material having a lattice structure that approximately matches or aligns with a lattice structure of a material of the first conductive layer 262 and/or of the second conductive layer 266, and a second material having a lattice structure that approximately matches or aligns with a lattice structure of a material of the insulator layer 264. The lattice structures of the materials of the insulator layer 264 and the first conductive layer 262 and/or of the second conductive layer 266 may approximately match in that that the materials may have approximately a same lattice constant or lattice size. Accordingly, the buffer layer described herein may reduce lattice mismatching between the insulator layer 264 and the first conductive layer 262 and/or of the second conductive layer 266, which may reduce the likelihood of and/or the amount of cracking, delamination, and/or another type of structural defect in the capacitor structure 260.

As further shown in FIG. 2, the capacitor structure 260 may be electrically connected with contacts that electrically connect the capacitor structure 260 to other conductive structures in the semiconductor device 200. A bottom metal contact 268 may be located in the dielectric layer 222, and a top metal contact 270 may be located in the dielectric layer 222. The bottom metal contact 268 may be electrically connected with the first conductive layer 262. The top metal contact 270 may be electrically connected with the second conductive layer 266. The second conductive layer 266 may have a width that is less than the width of the first conductive layer 262 such that the bottom metal contact 268 can land on the first conductive layer 262 without contacting (and electrically shorting to) the second conductive layer 266. The bottom metal contact 268 and the top metal contact 270 may each include tungsten (W), cobalt (Co), ruthenium (Ru), titanium (Ti), aluminum (Al), copper (Cu), and/or gold (Au), among other examples of conductive materials.

The bottom metal contact 268 may be physically coupled and/or electrically coupled with a conductive structure 272 and/or another type of BEOL metallization layer. The top metal contact 270 may be physically coupled and/or electrically coupled with a conductive structure 274 and/or another type of BEOL metallization layer. The conductive structures 272 and 274 may each include tungsten (W), cobalt (Co), ruthenium (Ru), titanium (Ti), aluminum (Al), copper (Cu), and/or gold (Au), among other examples of conductive materials. The conductive structures 272 and 274 may be included in the dielectric layer 226 and may be extend through the ESL 224. In some implementations, the conductive structures 272 and 274 are top metal layers in the semiconductor device 200.

As further shown in FIG. 2, the semiconductor device 200 may include one or more capping layers, such as capping layer 276, a capping layer 278, and/or a capping layer 280, among other examples. The capping layers 276-280 may be included over and/or on the capacitor structure 260. The capping layers 276-280 may electrically isolate the capacitor structure 260 from other structures in the dielectric layer 226. Additionally and/or alternatively, the capping layers 276-280 may function as a hard mask layer and/or an etch stop layer during manufacturing of the capacitor structure 260.

As indicated above, FIG. 2 is provided as an example. Other examples may differ from what is described with regard to FIG. 2.

Figure 3A:
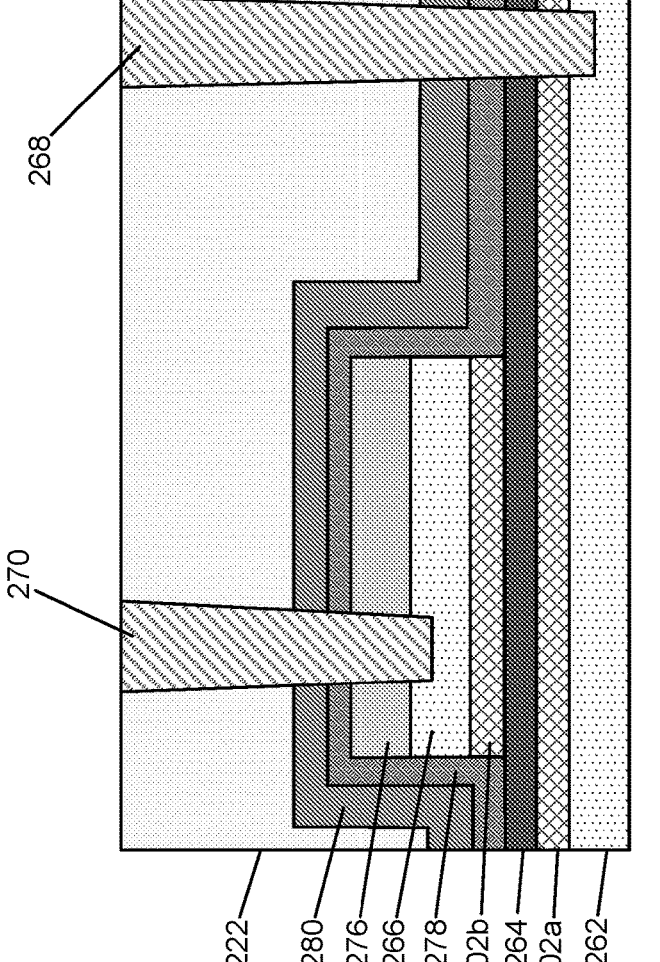
FIGS. 3A-3C are diagrams of an example implementation of a capacitor structure described herein.
Figure 3B:
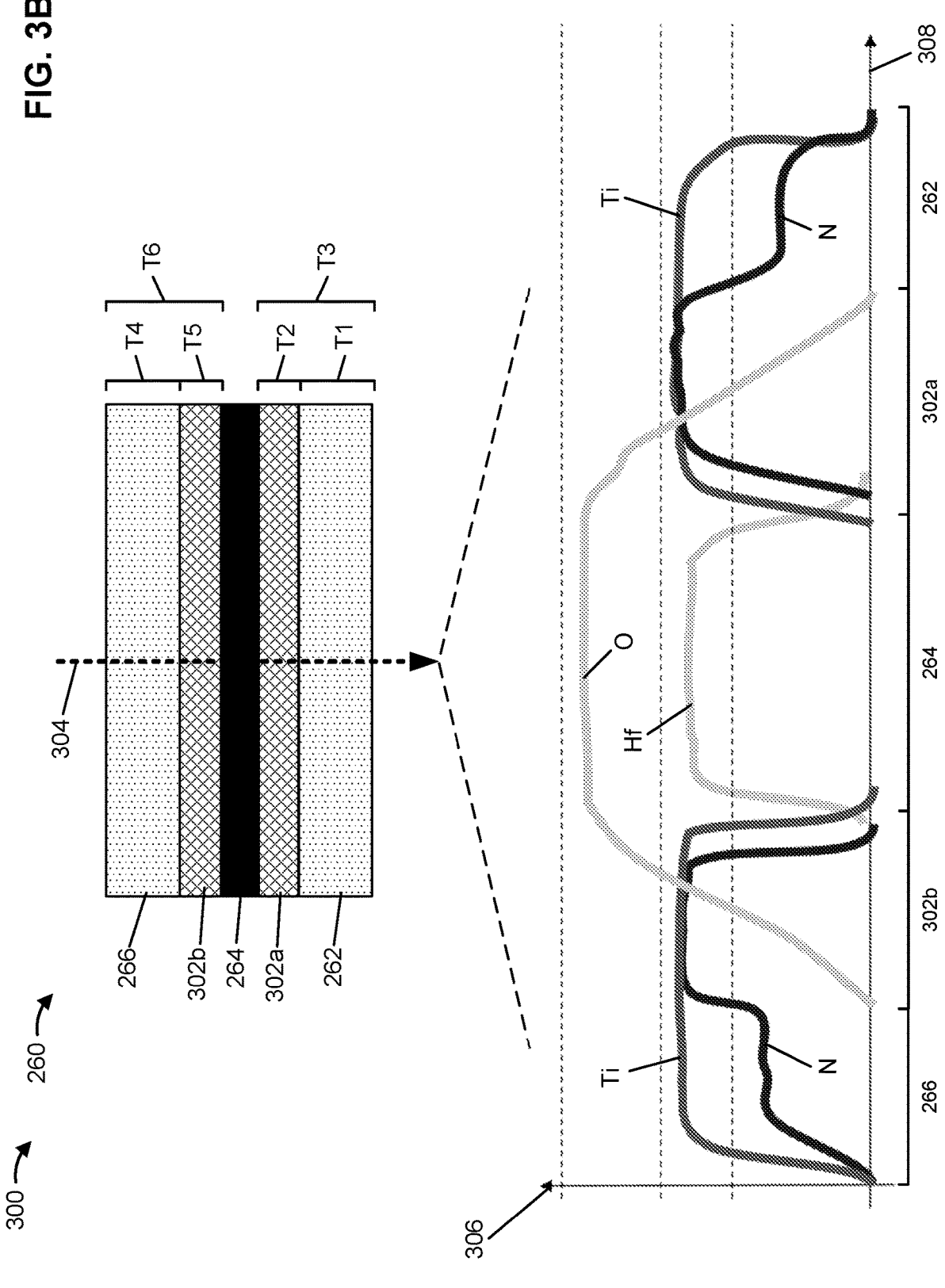
Figure 3C:
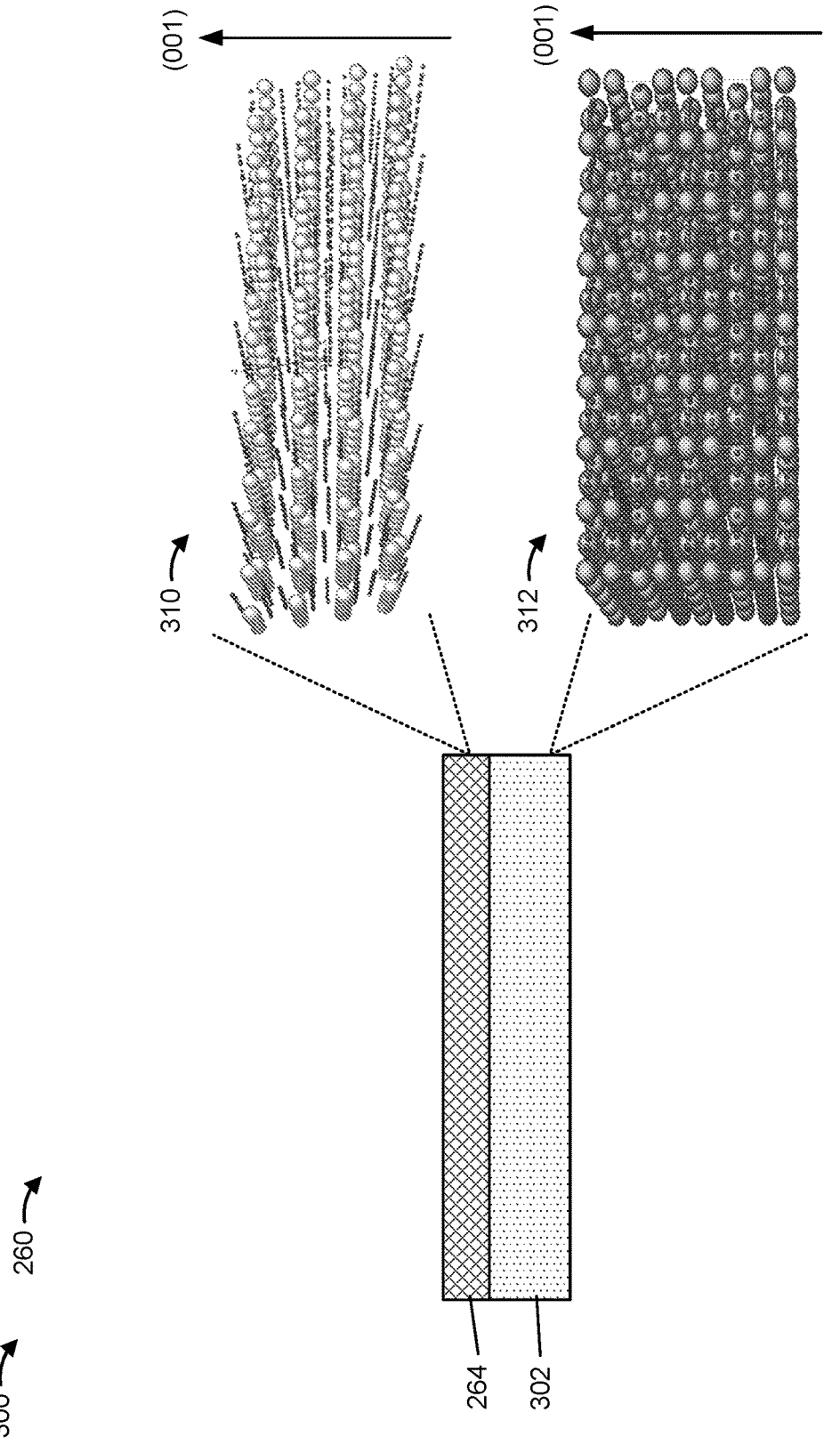

FIGS. 3A-3C are diagrams of an example implementation 300 of a capacitor structure 260 described herein. The capacitor structure 260 may be included in a semiconductor device, such as the semiconductor device 200 described herein.

As shown in FIG. 3A, the capacitor structure 260 may include a first conductive layer 262, an insulator layer 264 over the first conductive layer 262, and a second conductive layer 266 over the insulator layer 264. The capacitor structure 260 may further include capping layers 276-280, and may be electrically connected and/or physically connected with a bottom metal contact 268 and a top metal contact 270.

As further shown in FIG. 3A, the capacitor structure 260 may include one or more buffer layers to promote or facilitate lattice matching in the capacitor structure 260 to reduce the likelihood of cracking, delamination, and/or another type of structural defect in the capacitor structure 260. For example, the capacitor structure 260 may include a buffer layer 302a between the first conductive layer 262 and the insulator layer 264. The buffer layer 302a may be included over and/or on the first conductive layer 262, and the insulator layer 264 may be included over and/or on the buffer layer 302a. As another example, the capacitor structure 260 may include a buffer layer 302b between the second conductive layer 266 and the insulator layer 264. The buffer layer 302b may be included over and/or on the insulator layer 264, and the second conductive layer 266 may be included over and/or on the buffer layer 302b.

The buffer layer 302a may include a plurality of materials. The buffer layer 302a may include a first material that promotes or facilitates lattice matching between the first conductive layer 262 and the buffer layer 302a, and may include a second material that promotes or facilitates lattice matching between the insulator layer 264 and the buffer layer 302a.

In implementations in which the first conductive layer 262 includes a nitrogen-containing material or a nitride-containing material such as a titanium nitride ($Ti_xN$ such as $Ti_2N$), the first material of the buffer layer 302a may also include a nitrogen-containing material or a nitride-containing material such as a titanium nitride (TiN), which promotes or facilitates lattice matching through chemical bonding between the first conductive layer 262 and the buffer layer 302a. In some implementations, the first material is the same material that is included in the first conductive layer 262.

In implementations in which the insulator layer 264 includes an oxygen-containing material or an oxide-containing material such as a hafnium oxide ($HfO_x$ such as $HfO_2$), the second material of the buffer layer 302a may also include an oxygen-containing material or an oxide-containing material such as a titanium oxide ($TiO_x$ such as $TiO_2$). The second material may promote or facilitate lattice matching between the buffer layer 302a and the insulator layer 264. $TiO_2$ may be the most stable phase among titanium, oxygen, and nitrogen. For example, $TiO_2$ may have a formation/decomposition energy of approximately −3.502 electron-volts per atom (eV/atom), whereas titanium nitride (TiN) may have a formation/decomposition energy of approximately −1.896 eV/atom. However, other values for the range are within the scope of the present disclosure.

The buffer layer 302b may include a plurality of materials. The buffer layer 302b may include a first material that promotes or facilitates lattice matching between the second conductive layer 266 and the buffer layer 302b, and may include a second material that promotes or facilitates lattice matching between the insulator layer 264 and the buffer layer 302b.

In implementations in which the second conductive layer 266 includes a nitrogen-containing material or a nitride-containing material such as a titanium nitride ($Ti_xN$ such as $Ti_2N$), the first material of the buffer layer 302b may also include a nitrogen-containing material or a nitride-containing material such as a titanium nitride (TiN), which promotes or facilitates lattice matching through chemical bonding between the second conductive layer 266 and the buffer layer 302b. In some implementations, the first material is the same material that is included in the second conductive layer 266.

In implementations in which the insulator layer 264 includes an oxygen-containing material or an oxide-containing material such as a hafnium oxide ($HfO_x$ such as $HfO_2$), the second material of the buffer layer 302b may also include an oxygen-containing material or an oxide-containing material such as a titanium oxide ($TiO_x$ such as $TiO_2$). The second material may promote or facilitate lattice matching between the buffer layer 302b and the insulator layer 264. $TiO_2$ may be the most stable phase among titanium, oxygen, and nitrogen. For example, $TiO_2$ may have a formation/decomposition energy of approximately −3.502 electron-volts per atom (eV/atom), whereas titanium nitride (TiN) may have a formation/decomposition energy of approximately −1.896 eV/atom. However, other values for the range are within the scope of the present disclosure.

FIG. 3B illustrates an elemental composition of a plurality of layers of the capacitor structure 260 along a depth profile 304 of the capacitor structure 260. The elemental composition is illustrated as an atomic percentage 306 of one or more elements in the one or more layers as a function of depth 308 in the capacitor structure 260. In particular, the atomic percentage 306 of the one or more elements is illustrated from a top surface of the second conductive layer 266 to a bottom surface of the first conductive layer 262.

As shown in the depth profile 304 in FIG. 3B, the second conductive layer 266 and the buffer layer 302b may each include titanium (Ti) and nitrogen (N). In particular, the second conductive layer 266 and the buffer layer 302b may each include a titanium nitride (TiN). The atomic percentage 306 (or concentration) of titanium may be approximately the same (e.g., approximately a same concentration of titanium) in the second conductive layer 266 and the buffer layer 302b. The atomic percentage 306 (or concentration) of titanium may be approximately uniform along the depth 308 through the second conductive layer 266 and through the buffer layer 302b.

The buffer layer 302b may include a greater atomic percentage 306 (or concentration) of nitrogen relative to the atomic percentage 306 (or concentration) of nitrogen in the second conductive layer 266. In some implementations, a ratio of the atomic percentage 306 (or concentration) of nitrogen in the buffer layer 302*b* to the atomic percentage 306 (or concentration) of titanium in the buffer layer 302*b* may be included in a range of approximately 0.3:1 to less than approximately 1:1. In some implementations, a ratio of the atomic percentage 306 (or concentration) of nitrogen in the second conductive layer 266 to the atomic percentage 306 (or concentration) of titanium in the second conductive layer 266 may be included in a range of greater that approximately 0:1 to approximately 0.5:1. In some implementations, the ratio of the atomic percentage 306 (or concentration) of nitrogen in the buffer layer 302*b* to the atomic percentage 306 (or concentration) of titanium in the buffer layer 302*b* may be greater relative to the ratio of the atomic percentage 306 (or concentration) of nitrogen in the second conductive layer 266 to the atomic percentage 306 (or concentration) of titanium in the second conductive layer 266. In some implementations, the ratio of the atomic percentage 306 (or concentration) of nitrogen in the buffer layer 302*b* to the atomic percentage 306 (or concentration) of titanium in the buffer layer 302*b*, to the ratio of the atomic percentage 306 (or concentration) of nitrogen in the second conductive layer 266 to the atomic percentage 306 (or concentration) of titanium in the second conductive layer 266, may be greater than approximately 1.2:1. However, other values are within the scope of the present disclosure.

As further shown in the depth profile 304 in FIG. 3B, the buffer layer 302*b* may include oxygen (O). In particular, the buffer layer 302*b* may include a titanium oxide (TiO$_x$ such as TiO$_2$). The atomic percentage 306 (or concentration) of oxygen may be non-uniform along the depth 308 in buffer layer 302*b*. In other words, the oxygen concentration in the buffer layer 302*b* changes between a top surface of the buffer layer 302*b* and a bottom surface of the buffer layer 302*b*. In particular, the atomic percentage 306 (or concentration) of oxygen may increase as a function of depth 308 in the buffer layer 302*b*. The atomic percentage 306 (or concentration) of oxygen may be greater at a bottom surface of the buffer layer 302*b* relative to the atomic percentage 306 (or concentration) of oxygen at a top surface of the buffer layer 302*b*.

As further shown in the depth profile 304 in FIG. 3B, the insulator layer 264 may include oxygen (O) and hafnium (Hf). In particular, the insulator layer 264 may include a hafnium oxide (HfO$_x$ such as HfO$_2$). The atomic percentage 306 (or concentration) of oxygen may be approximately uniform along the depth 308 in insulator layer 264. Similarly, the atomic percentage 306 (or concentration) of hafnium may be approximately uniform along the depth 308 in insulator layer 264.

As shown in the depth profile 304 in FIG. 3B, the first conductive layer 262 and the buffer layer 302*a* may each include titanium (Ti) and nitrogen (N). In particular, the first conductive layer 262 and the buffer layer 302*a* may each include a titanium nitride (Ti$_x$N). The first conductive layer 262 may include Ti$_2$N, and the buffer layer 302*a* may include TiN. The atomic percentage 306 (or concentration) of titanium may be approximately the same (e.g., approximately a same concentration of titanium) in the first conductive layer 262 and the buffer layer 302*a*. The atomic percentage 306 (or concentration) of titanium may be approximately uniform along the depth 308 through the first conductive layer 262 and through the buffer layer 302*a*.

The buffer layer 302*a* may include a greater atomic percentage 306 (or concentration) of nitrogen relative to the atomic percentage 306 (or concentration) of nitrogen in the first conductive layer 262. In some implementations, a ratio of the atomic percentage 306 (or concentration) of nitrogen in the buffer layer 302*a* to the atomic percentage 306 (or concentration) of titanium in the buffer layer 302*a* may be included in a range of approximately 0.3:1 to less than approximately 1:1. In some implementations, a ratio of the atomic percentage 306 (or concentration) of nitrogen in the first conductive layer 262 to the atomic percentage 306 (or concentration) of titanium in the first conductive layer 262 may be included in a range of greater that approximately 0:1 to approximately 0.5:1. In some implementations, the ratio of the atomic percentage 306 (or concentration) of nitrogen in the buffer layer 302*a* to the atomic percentage 306 (or concentration) of titanium in the buffer layer 302*a* may be greater relative to the ratio of the atomic percentage 306 (or concentration) of nitrogen in the first conductive layer 262 to the atomic percentage 306 (or concentration) of titanium in the first conductive layer 262. In some implementations, the ratio of the atomic percentage 306 (or concentration) of nitrogen in the buffer layer 302*a* to the atomic percentage 306 (or concentration) of titanium in the buffer layer 302*a*, to the ratio of the atomic percentage 306 (or concentration) of nitrogen in the first conductive layer 262 to the atomic percentage 306 (or concentration) of titanium in the first conductive layer 262, may be greater than approximately 1.2:1. However, other values are within the scope of the present disclosure.

As further shown in the depth profile 304 in FIG. 3B, the buffer layer 302*a* may include oxygen (O). In particular, the buffer layer 302*a* may include a titanium oxide (TiO$_x$ such as TiO$_2$). The atomic percentage 306 (or concentration) of oxygen may be non-uniform along the depth 308 in buffer layer 302*a*. In other words, the oxygen concentration in the buffer layer 302*a* changes between a top surface of the buffer layer 302*a* and a bottom surface of the buffer layer 302*a*. In particular, the atomic percentage 306 (or concentration) of oxygen may decrease as a function of depth 308 in the buffer layer 302*a*. The atomic percentage 306 (or concentration) of oxygen may be greater at a top surface of the buffer layer 302*a* relative to the atomic percentage 306 (or concentration) of oxygen at a bottom surface of the buffer layer 302*a*.

FIG. 3B further illustrates one or more dimensions of one or more layers of the capacitor structure 260. As shown in FIG. 3B, an example dimension includes a thickness T1 of the first conductive layer 262. Another example dimension includes a thickness T2 of the buffer layer 302*a*. In some implementations, the thickness T1 is included in a range of approximately 30 nanometers to approximately 59 nanometers. However, other values for the range are within the scope of the present disclosure. In some implementations, the thickness T2 is included in a range of approximately 1 nanometer to approximately 30 nanometers so that the buffer layer 302*a* can provide a sufficient amount of lattice matching between the first conductive layer 262 and the insulator layer 264 to reduce the likelihood of cracking and delamination in the capacitor structure 260. However, other values for the range are within the scope of the present disclosure.

In some implementations, a combination of the thickness T1 and the thickness T2 (illustrated in FIG. 3B as a thickness T3) is included in a range of approximately 40 nanometers to approximately 60 nanometers. The thickness T3 may be selected to be at least approximately 40 nanometers to achieve a sufficiently low resistance for the capacitor structure 260 and a sufficiently high capacitance for the capacitor structure 260, whereas the thickness T3 may be selected to be approximately 60 nanometers or less to achieve a particular capacitance for the capacitor structure 260. However, other values for the range are within the scope of the present disclosure.

In some implementations, a ratio of the thickness T2 to the thickness T1 is included in a range of approximately 0.1:1 to approximately 0.8:1 to achieve sufficient lattice matching between the first conductive layer 262 and the insulator layer 264 to reduce the likelihood of cracking and delamination in the capacitor structure 260. However, other values for the range are within the scope of the present disclosure. In some implementations, a ratio of the thickness T2 to the thickness T1 is included in a range of approximately 0.05:1 to approximately 0.8:1 to achieve sufficient lattice matching between the first conductive layer 262 and the insulator layer 264 to reduce the likelihood of cracking and delamination in the capacitor structure 260. However, other values for the range are within the scope of the present disclosure.

As further shown in FIG. 3B, another example dimension includes a thickness T4 of the second conductive layer 266. Another example dimension includes a thickness T5 of the buffer layer 302b. In some implementations, the thickness T4 is included in a range of approximately 30 nanometers to approximately 59 nanometers. However, other values for the range are within the scope of the present disclosure. In some implementations, the thickness T5 is included in a range of approximately 1 nanometer to approximately 30 nanometers so that the buffer layer 302b can provide a sufficient amount of lattice matching between the second conductive layer 266 and the insulator layer 264 to reduce the likelihood of cracking and delamination in the capacitor structure 260. However, other values for the range are within the scope of the present disclosure.

In some implementations, a combination of the thickness T4 and the thickness T5 (illustrated in FIG. 3B as a thickness T6) is included in a range of approximately 40 nanometers to approximately 60 nanometers. The thickness T6 may be selected to be at least approximately 40 nanometers to achieve a sufficiently low resistance for the capacitor structure 260 and a sufficiently high capacitance for the capacitor structure 260, whereas the thickness T6 may be selected to be approximately 60 nanometers or less to achieve a particular capacitance for the capacitor structure 260. However, other values for the range are within the scope of the present disclosure.

In some implementations, a ratio of the thickness T5 to the thickness T4 is included in a range of approximately 0.1:1 to approximately 0.8:1 to achieve sufficient lattice matching between the second conductive layer 266 and the insulator layer 264 to reduce the likelihood of cracking and delamination in the capacitor structure 260. However, other values for the range are within the scope of the present disclosure.

In some implementations, a thickness of the insulator layer 264 is included in a range of approximately 100 nanometers to approximately 200 nanometers. However, other values for the range are within the scope of the present disclosure. In some implementations, a thickness of the capping layer 276 may be included in a range of approximately 200 angstroms to approximately 300 angstroms. However, other values for the range are within the scope of the present disclosure. In some implementations, a thickness of the capping layer 278 may be included in a range of approximately 100 angstroms to approximately 300 angstroms. However, other values for the range are within the scope of the present disclosure. In some implementations, a thickness of the capping layer 280 may be included in a range of approximately 400 angstroms to approximately 600 angstroms. However, other values for the range are within the scope of the present disclosure.

FIG. 3C illustrates an example of the lattice structures of the insulator layer 264 of the capacitor structure 260 and a buffer layer 302. The buffer layer 302 may correspond to the buffer layer 302a and/or the buffer layer 302b of the capacitor structure 260. As shown in FIG. 3C, the insulator layer 264 may have a lattice structure 310. The lattice structure 310 may be a lattice structure of hafnium oxide (HfO$_x$ such as HfO$_2$) or another high-k material having a (001) crystal structure. The lattice structure 310 of the insulator layer 264 may further have a space group (e.g., the symmetry group of the lattice structure 310 in three-dimensional space) of P2$_1$/c [14] in Hermann-Mauguin notation. The crystal system of the lattice structure 310 may be monoclinic.

As further shown in FIG. 3C, the buffer layer 302 may have a lattice structure 312. The lattice structure 312 may be a lattice structure of an oxygen-containing material or an oxide-containing material such as titanium oxide (TiO$_x$ such as TiO$_2$) that has a (001) crystal structure that approximately matches with the (001) crystal structure of the material of the insulator layer 264. The lattice structure 312 of the buffer layer 302 may further have a space group (e.g., the symmetry group of the lattice structure 312 in three-dimensional space) of I4$_1$/amd [141] in Hermann-Mauguin notation. The crystal system of the lattice structure 312 may be tetragonal.

The (001) crystal structure of the oxygen-containing material of the buffer layer 302, and the (001) crystal structure of the material of the insulator layer 264, may result in a relatively low elastic energy between the insulator layer 264 and the buffer layer 302. For example, the elastic energy between the insulator layer 264 and the buffer layer 302 may be less than approximately 0.600 eV/atom and as low as 0.268 eV/atom or less. The relatively low elastic energy between the insulator layer 264 and the buffer layer 302 (e.g., relative to the elastic energy directly between the insulator layer 264 and the first conductive layer 262 and/or the second conductive layer 266) results in a lesser elastic potential energy of repulsion between the insulator layer 264 and the buffer layer 302 relative to the elastic potential energy of repulsion between the insulator layer 264 and the first conductive layer 262 and/or the second conductive layer 266.

Additionally and/or alternatively, the lattice structure 310 of the insulator layer 264 may have a (111) crystal structure and the lattice structure 312 of the buffer layer 302 may have a (110) crystal structure. In these implementations, the crystal structures of insulator layer 264 and the buffer layer 302 may achieve an elastic energy between the insulator layer 264 and the buffer layer 302 that is less than approximately 0.600 eV/atom and as low as 0.268 eV/atom or less.

The buffer layer 302 may further include a nitrogen-containing material or a nitride-containing material, such as a titanium nitride (TiN) that promotes lattice matching between the buffer layer 302 and the first conductive layer 262 and/or the second conductive layer 266 of the capacitor structure 260. In particular, the nitrogen-containing material may be approximately a same material as the material of the first conductive layer 262 and/or the second conductive layer 266. Thus, the nitrogen-containing material in the buffer layer 302 may chemically bond with the material of the first conductive layer 262 and/or the second conductive layer 266.

The nitrogen-containing material in the buffer layer 302 may further promote lattice matching between the oxygen-containing material and the nitrogen-containing material in the buffer layer 302. The lattice structure of the nitrogen-containing material may have a (001) crystal structure that approximately matches with the (001) crystal structure of the lattice structure 312 of the oxygen-containing material. The (001) crystal structure of the oxygen-containing material and the (001) crystal structure of the nitrogen-containing material may result in a relatively low elastic energy, such as less than approximately 0.600 eV/atom and as low as 0.106 eV/atom or less. Additionally and/or alternatively, the lattice structure of the nitrogen-containing material may have a (100) crystal structure and the oxygen-containing material may have a (111) crystal structure. In these implementations, the crystal structures of may achieve an elastic energy that is less than approximately 0.600 eV/atom and as low as 0.207 eV/atom or less.

As indicated above, FIGS. 3A-3C are provided as an example. Other examples may differ from what is described with regard to FIGS. 3A-3C.

Figure 4A:
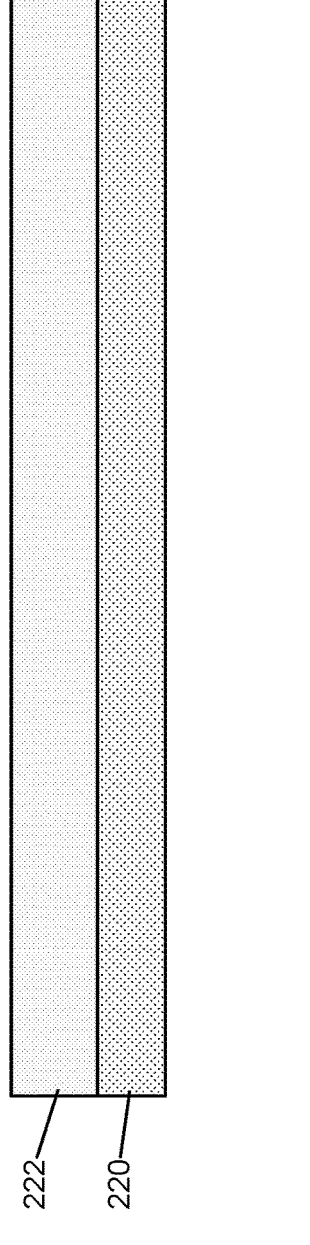
FIGS. 4A-4U are diagrams of an example implementation of forming a capacitor structure described herein.
Figure 4B:
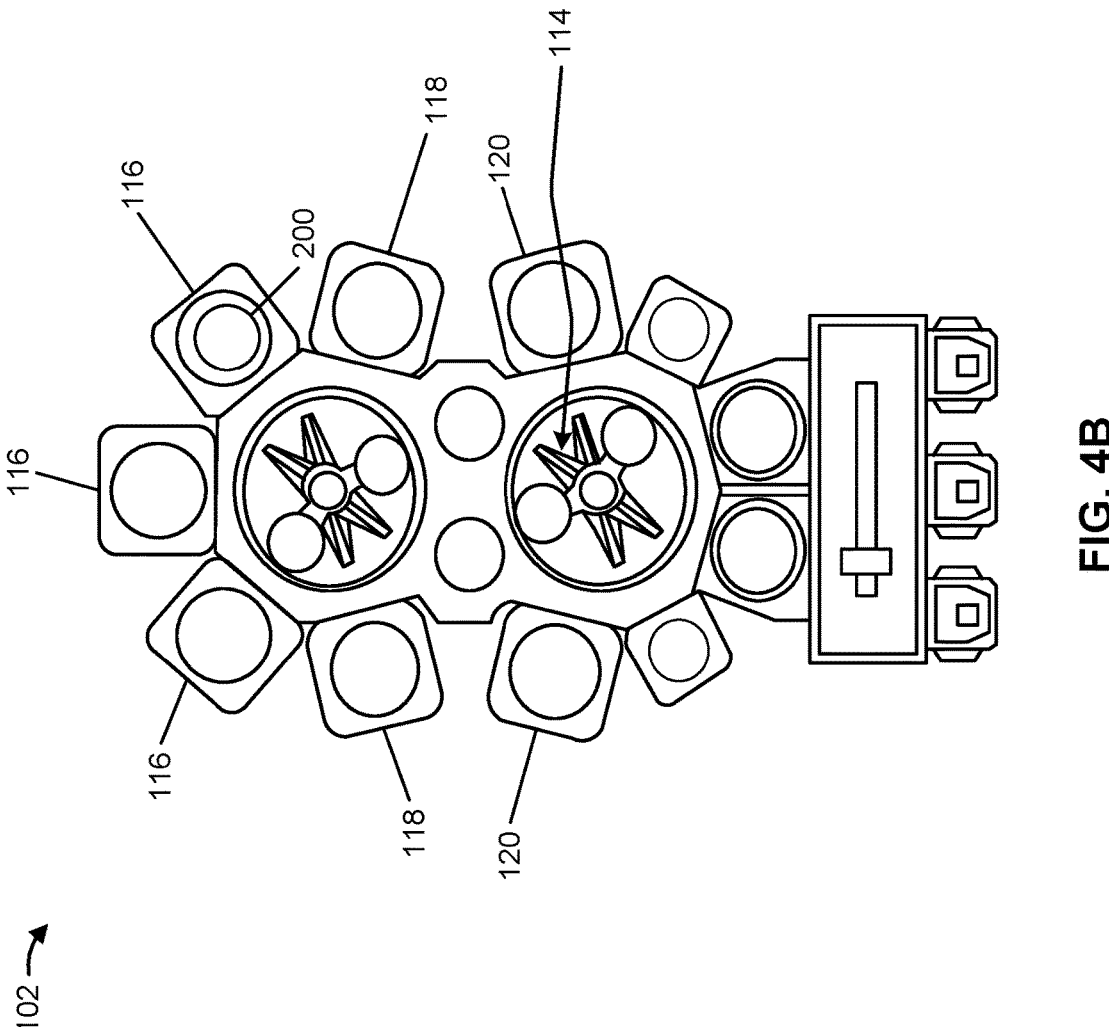
Figure 4C:
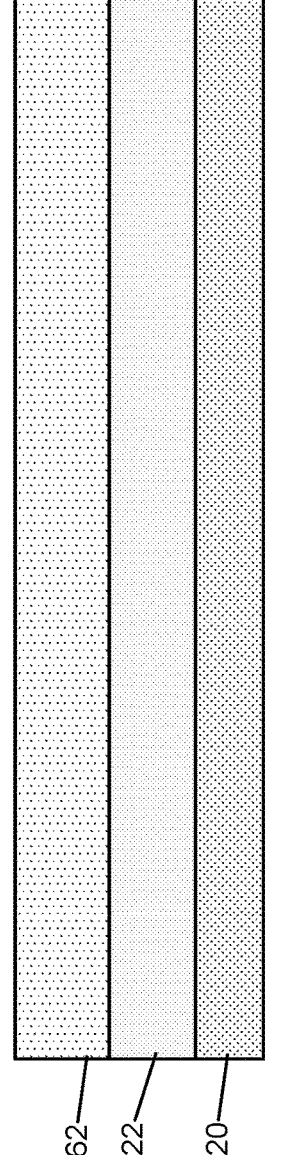
Figure 4D:
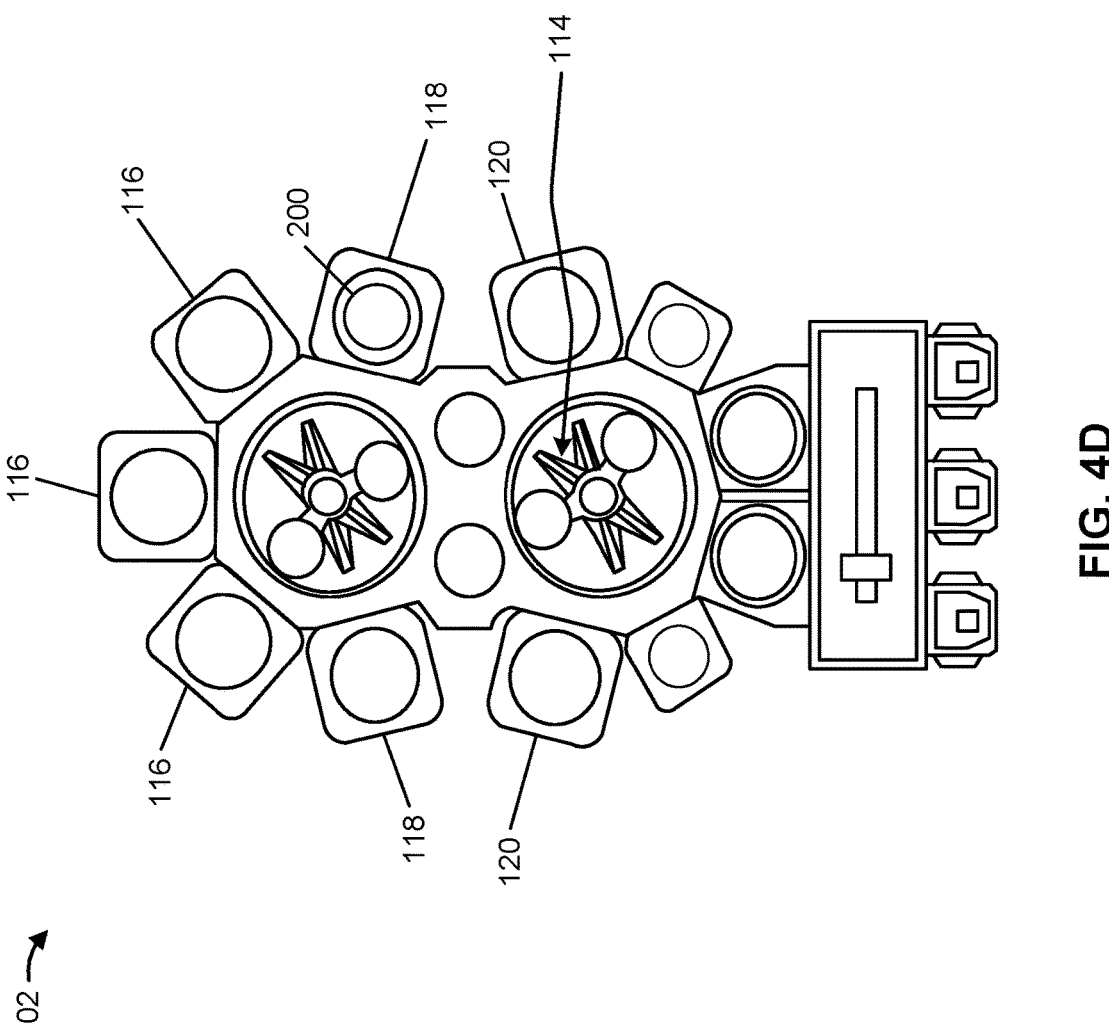
Figure 4E:
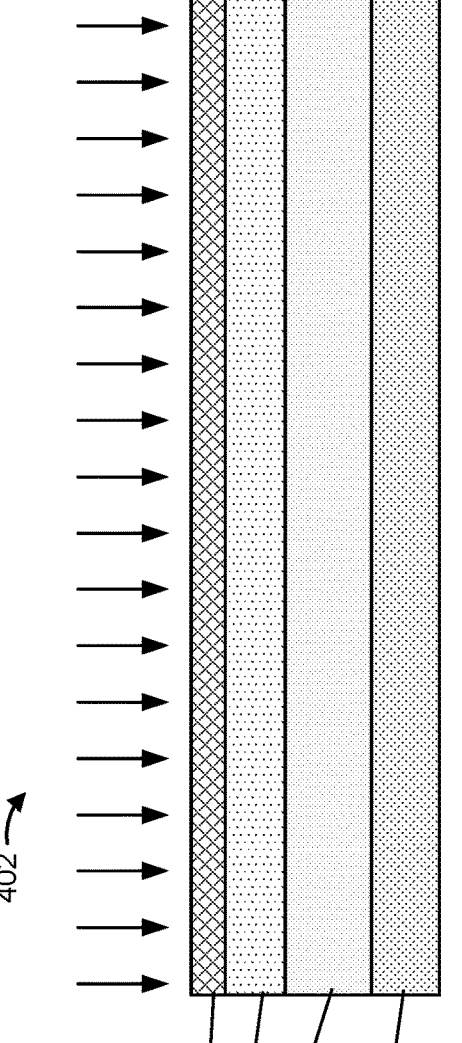
Figure 4F:
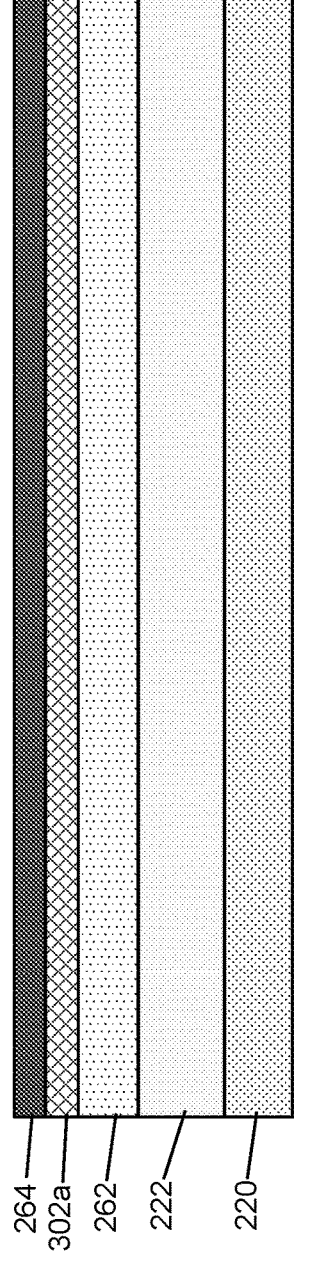
Figure 4G:
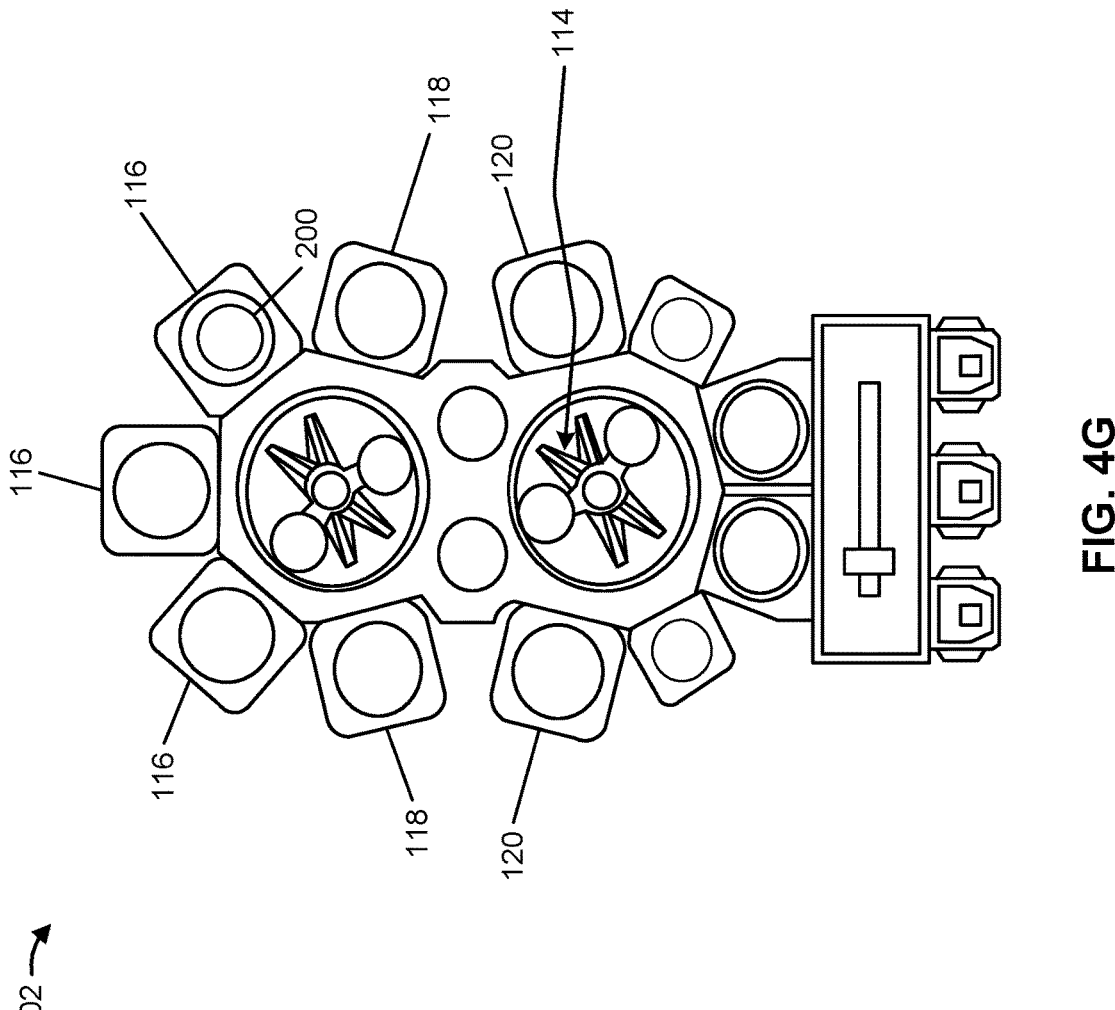
Figure 4H:
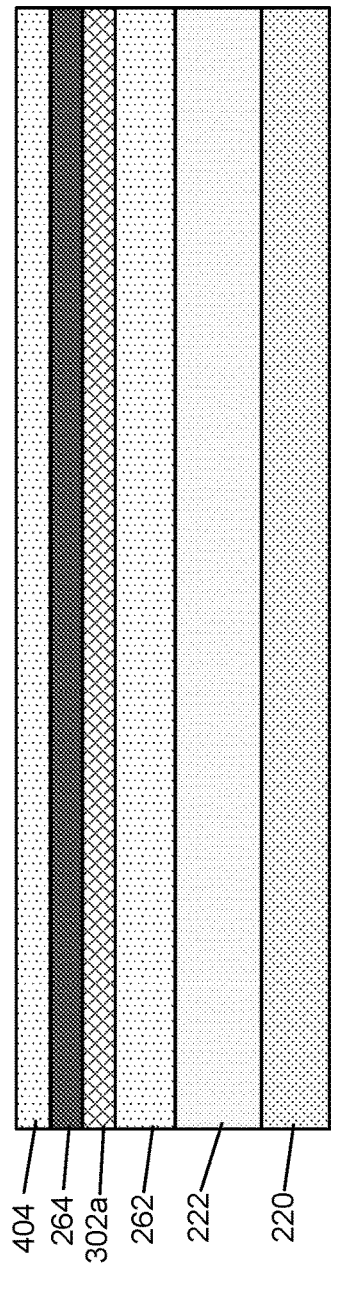
Figure 4I:
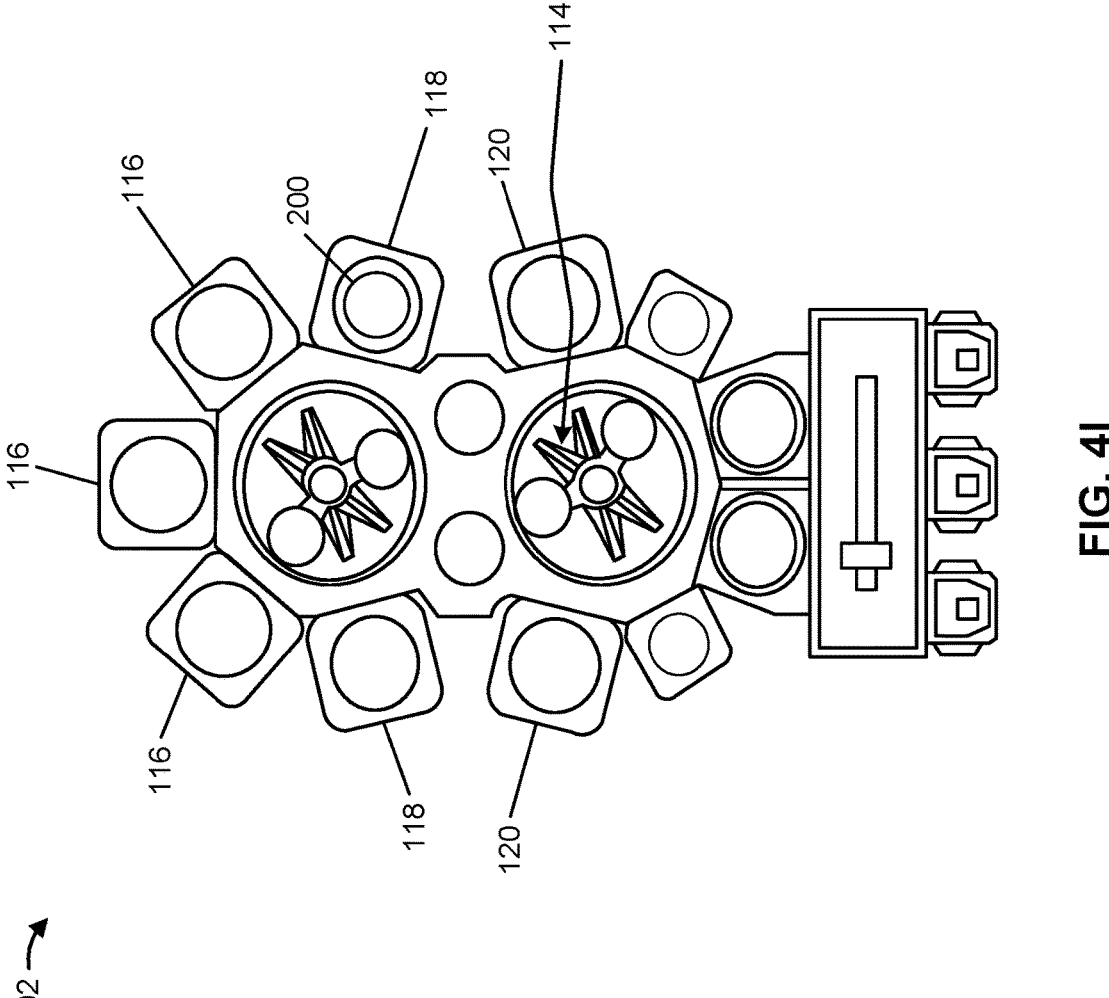
Figure 4J:
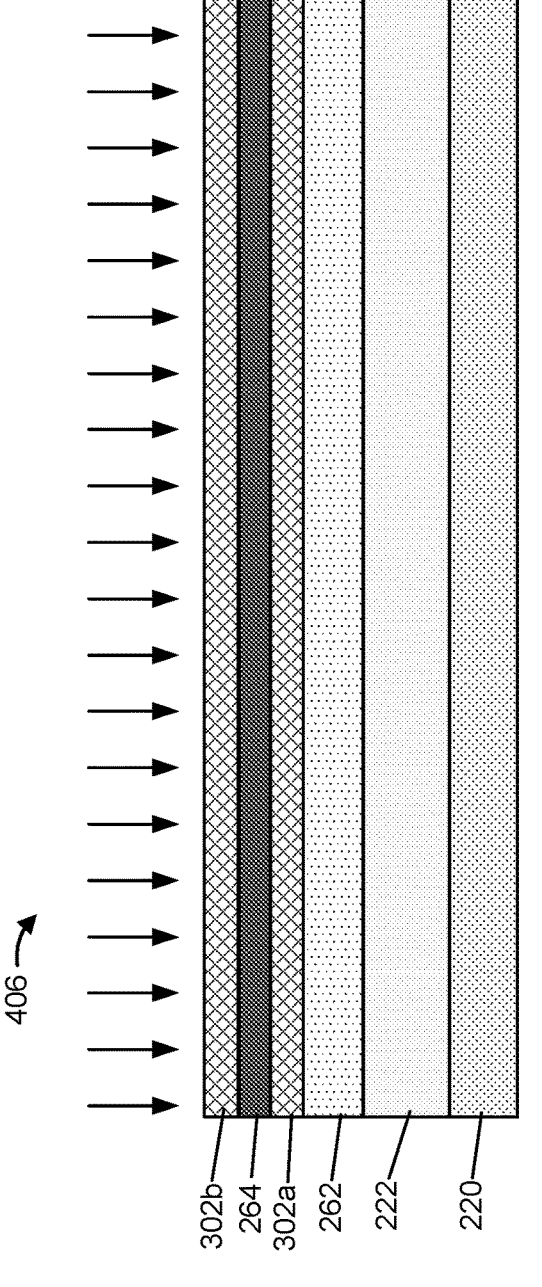
Figure 4K:
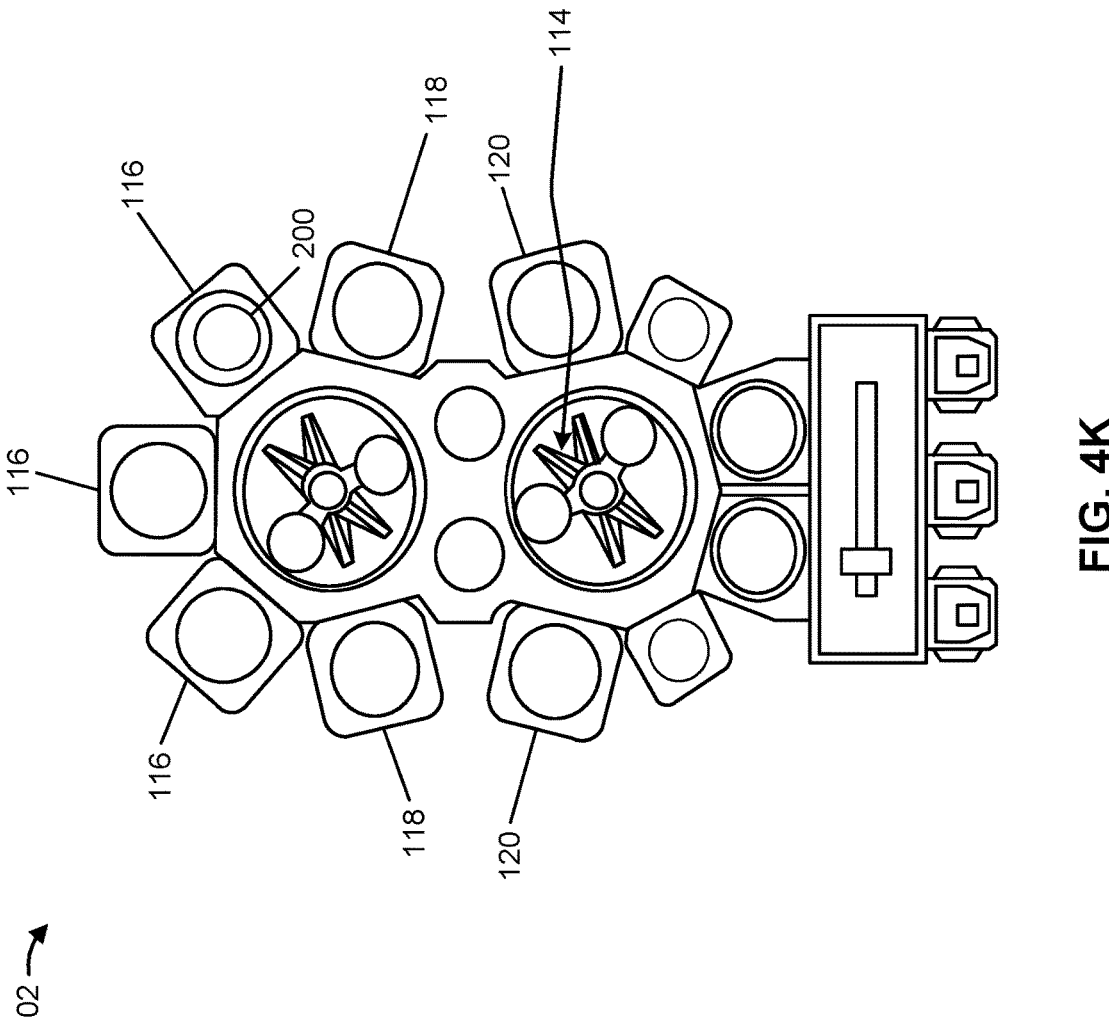
Figure 4L:
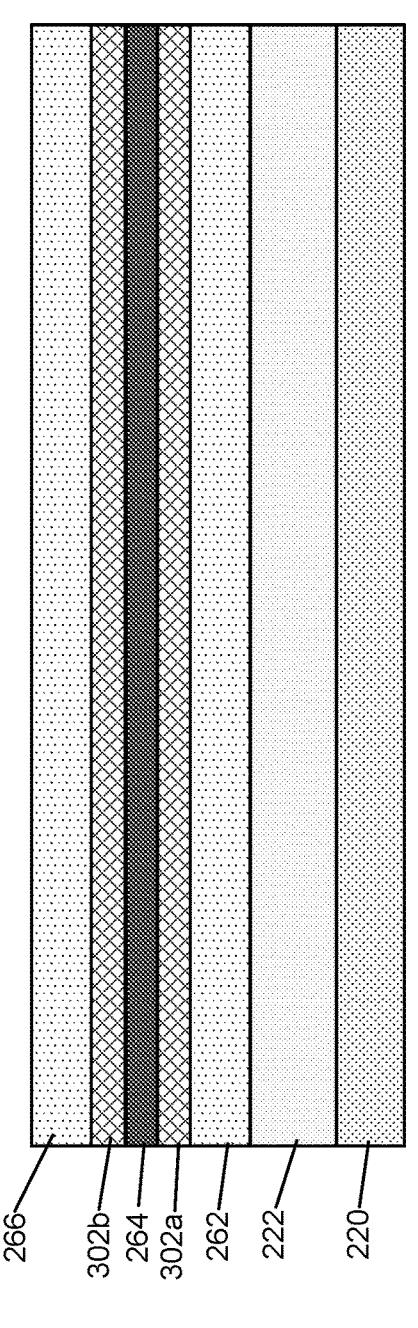
Figure 4M:
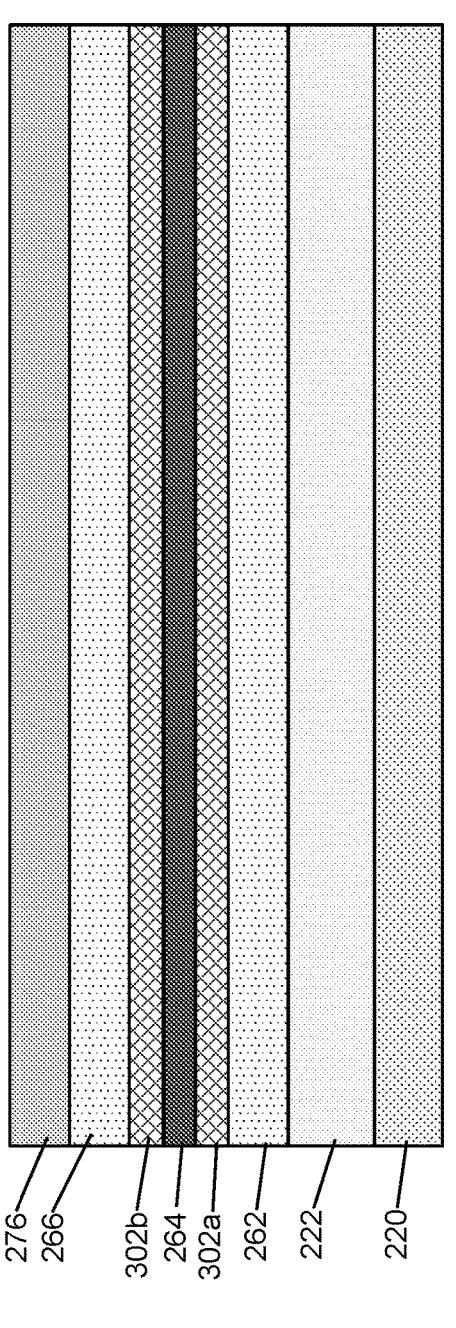
Figure 4N:
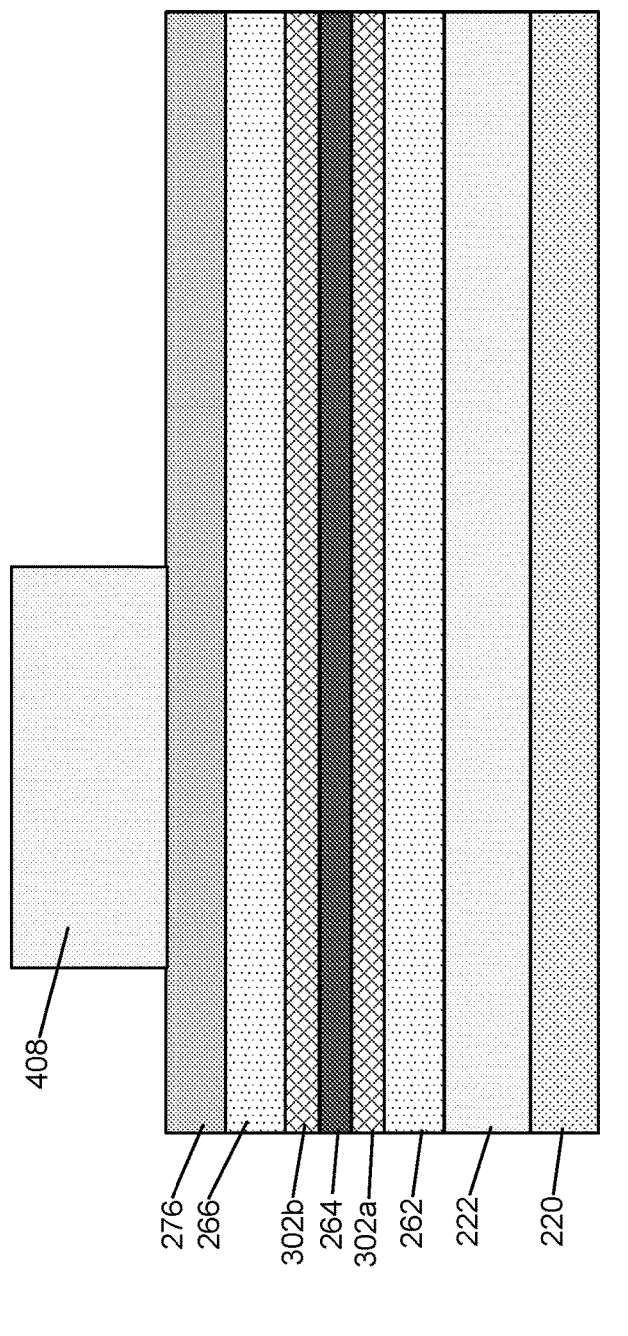
Figure 40:
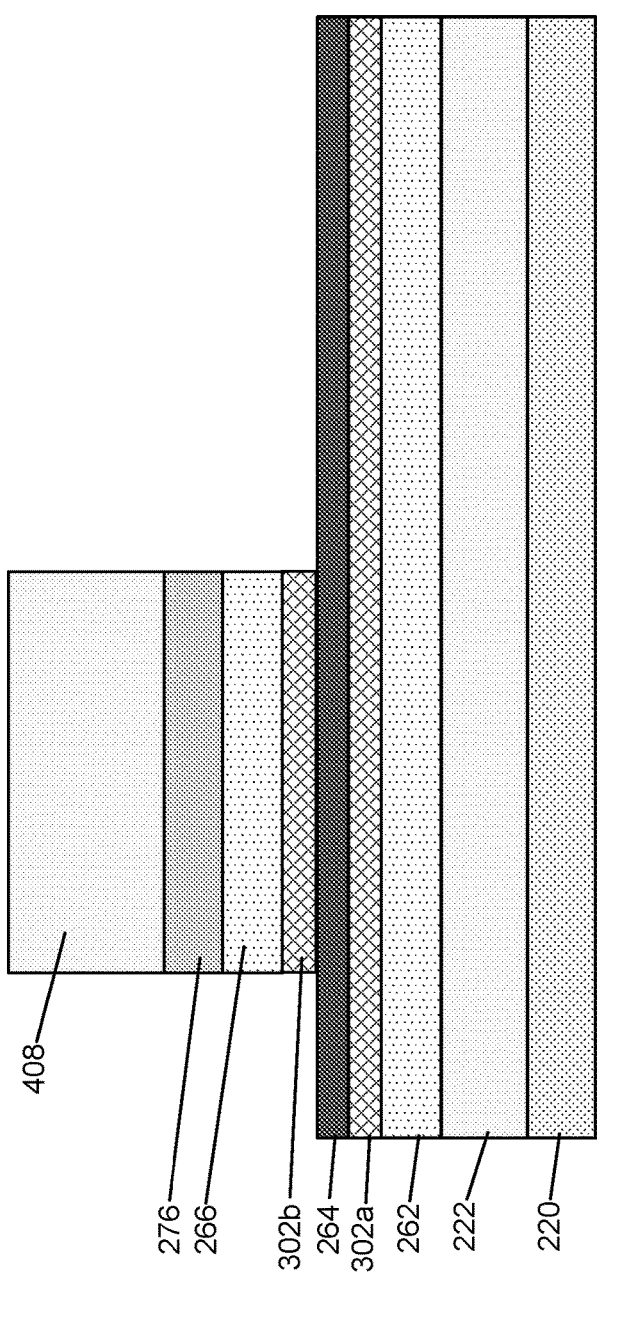
Figure 4P:
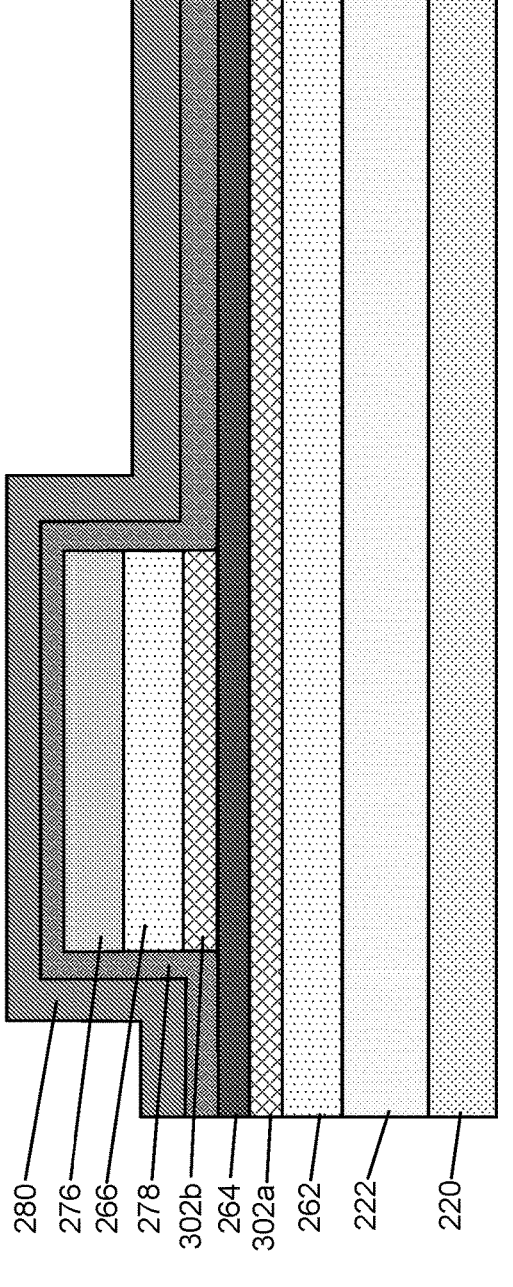
Figure 4Q:
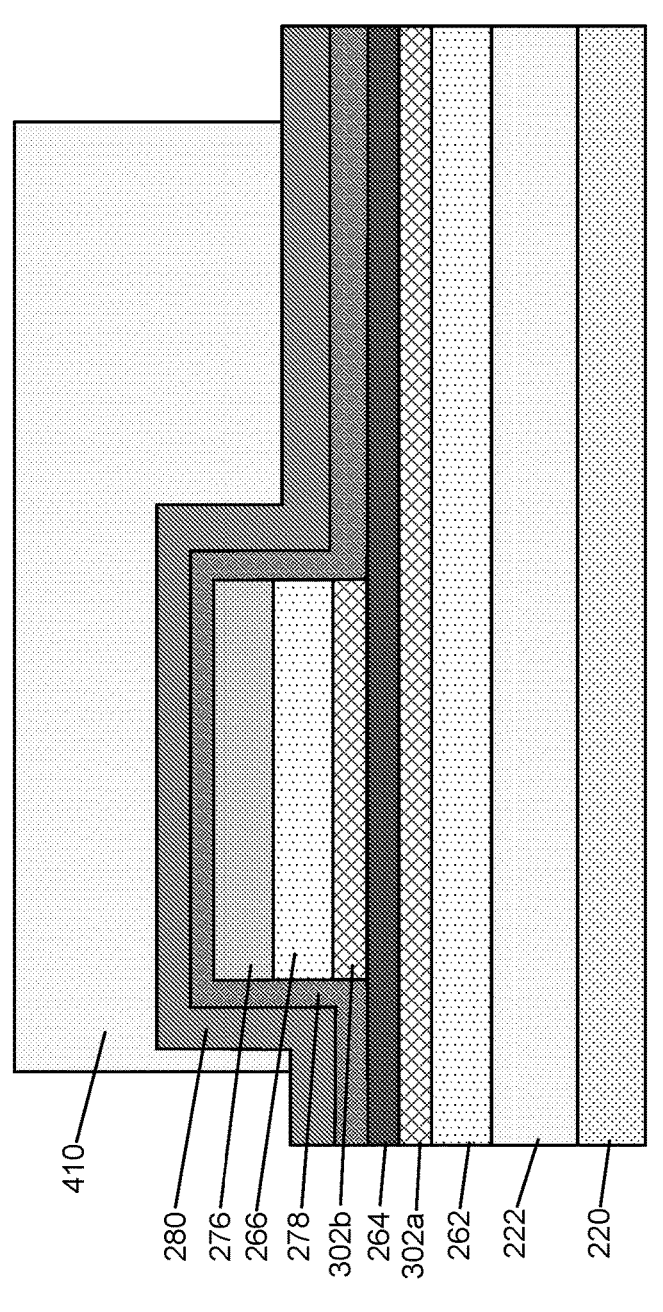
Figure 4R:
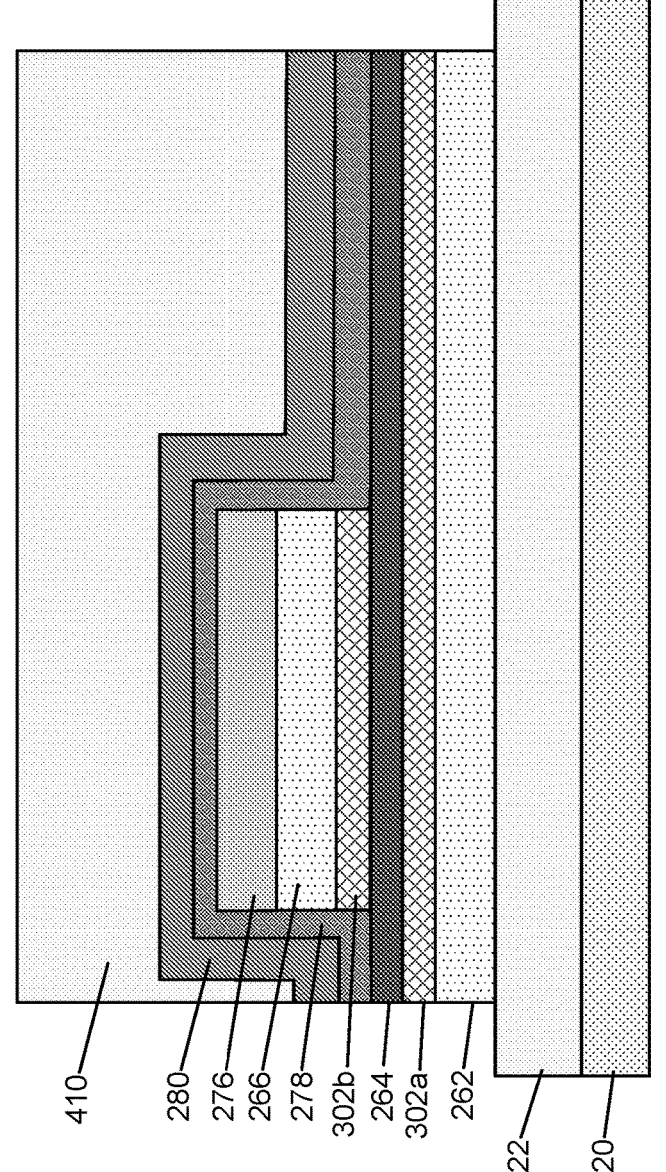
Figure 4S:
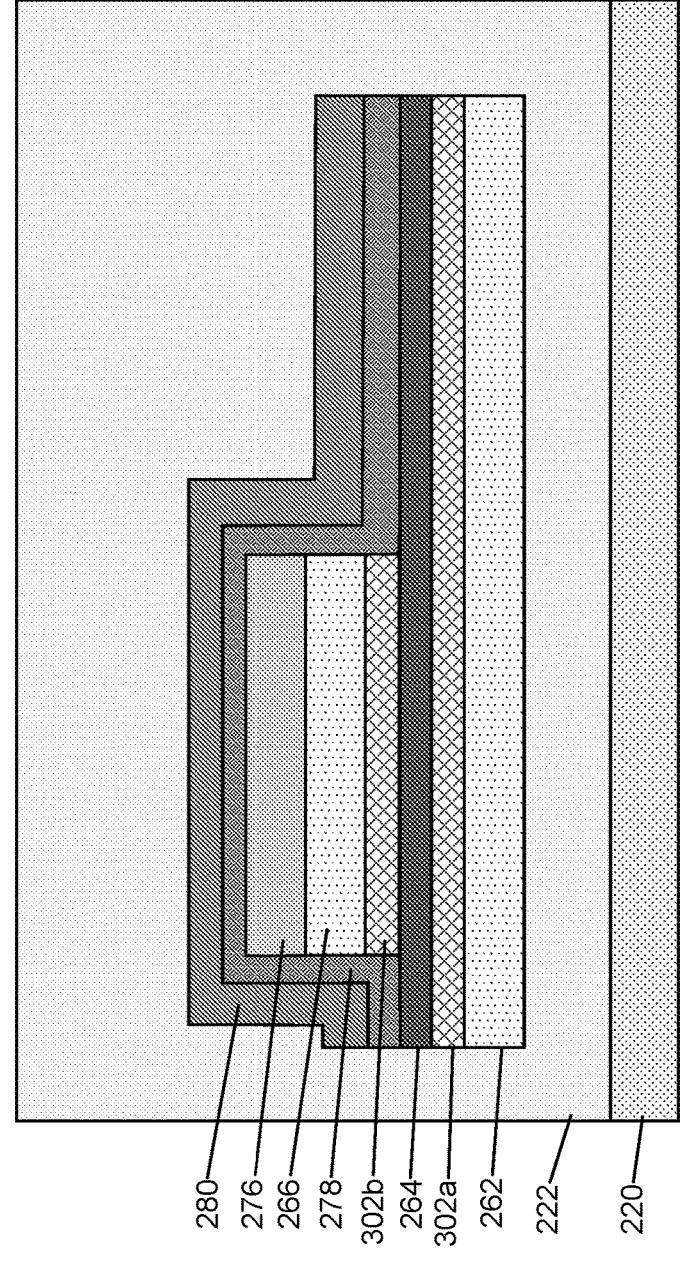
Figure 4T:
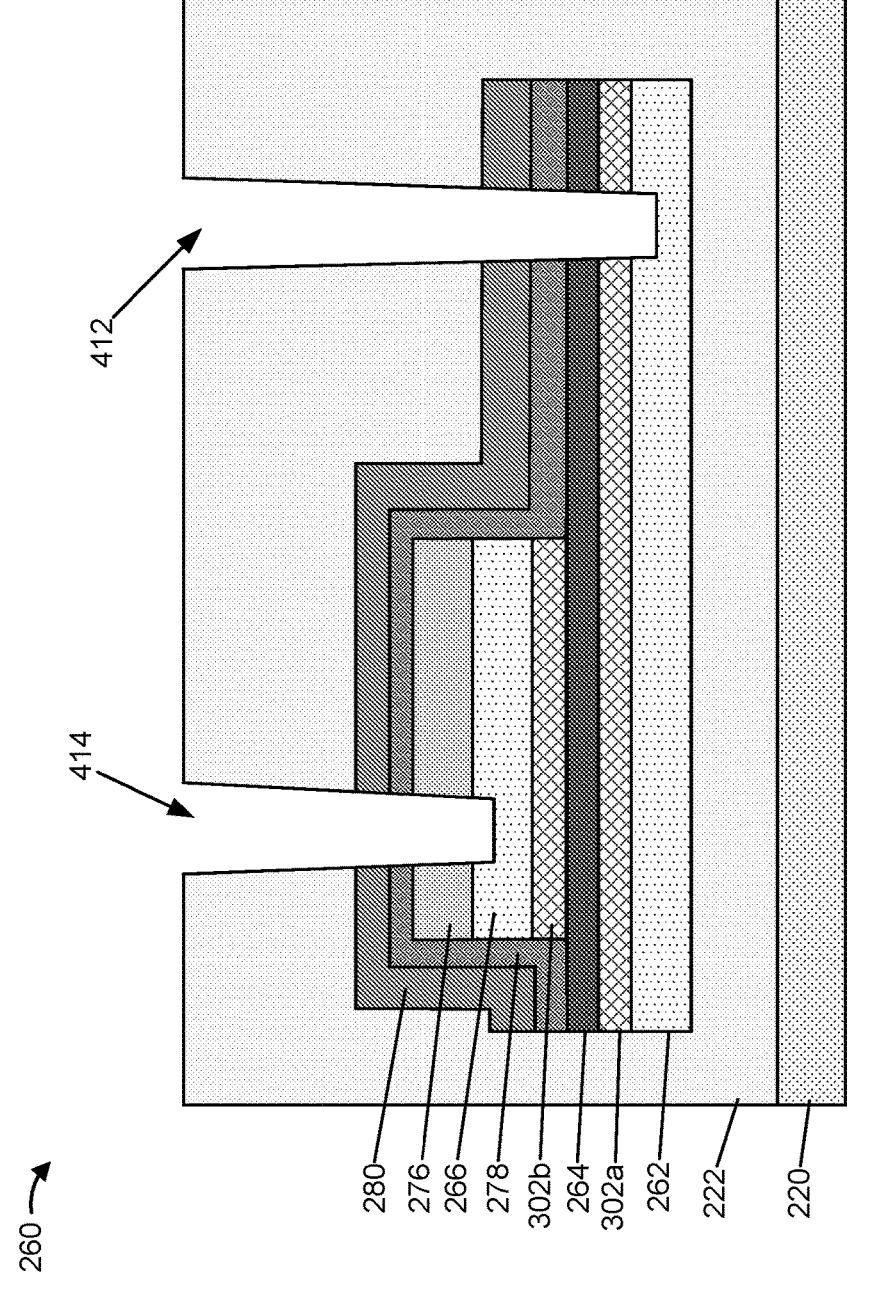
Figure 4U:
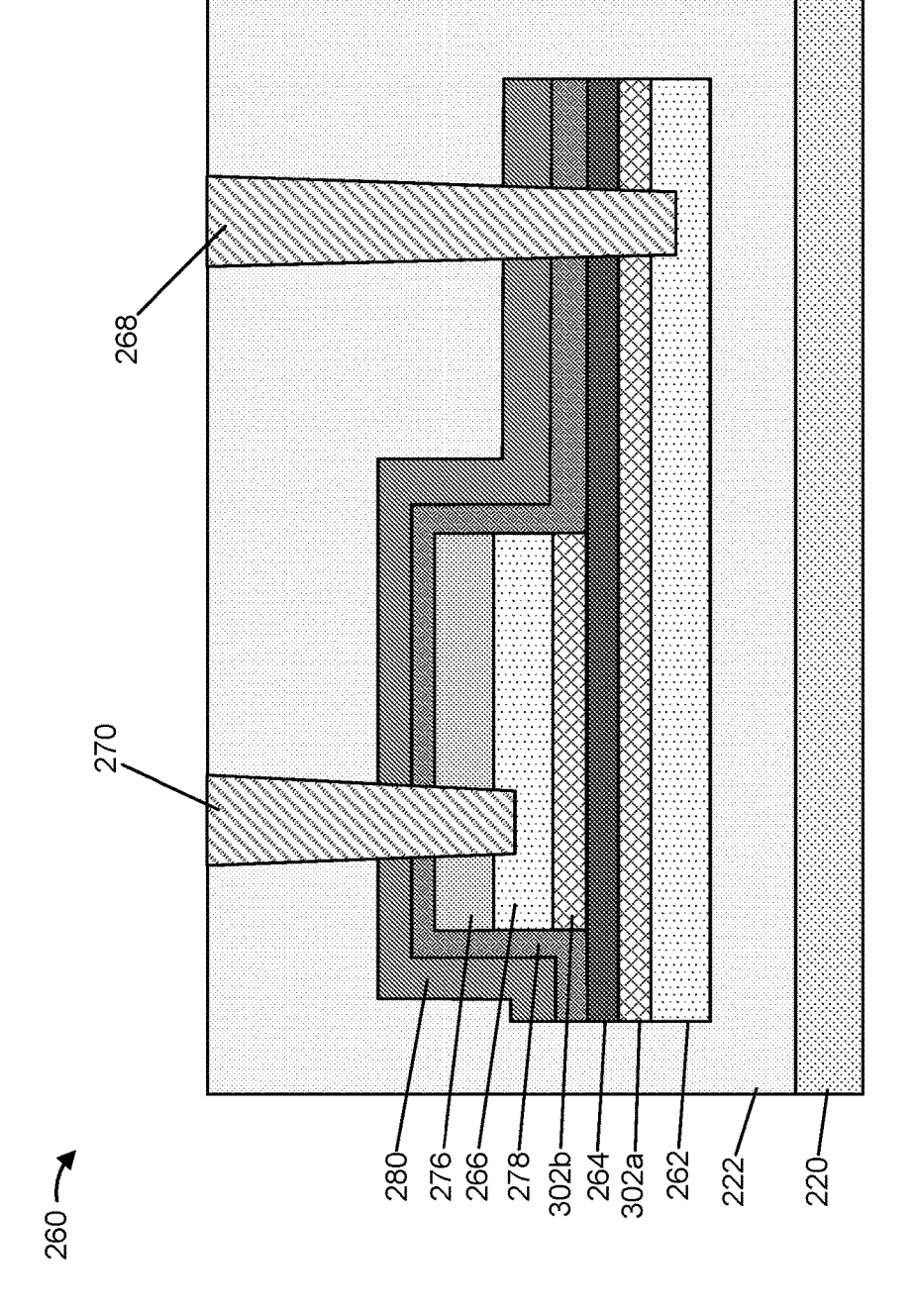

FIGS. 4A-4U are diagrams of an example implementation 400 of forming a capacitor structure 260 described herein. In particular, the example implementation 400 includes an example of forming a capacitor structure 260 that includes one or more buffer layers 302, such as a buffer layer 302a between a first conductive layer 262 and an insulator layer 264, and/or a buffer layer 302b between a second conductive layer 266 and an insulator layer 264. While FIGS. 4A-4U illustrate the process of forming the capacitor structure 260 to include both the buffer layer 302a and the buffer layer 302b, other implementations include forming the capacitor structure 260 to include the buffer layer 302a and not the buffer layer 302b, as well as forming the capacitor structure 260 to include the buffer layer 302b and not the buffer layer 302a. In some implementations, the capacitor structure 260 may be formed in a semiconductor device, such as a semiconductor device 200. In some implementations, the capacitor structure 260 may be formed in a BEOL region of the semiconductor device 200.

Turning to FIG. 4A, one or more of the operations performed in connection with forming the capacitor structure 260 may be performed after one or more operations to form other layers and/or structures in the semiconductor device 200. For example, one or more of the operations performed in connection with forming the capacitor structure 260 may be performed after one or more operations to form an ESL 220 in the BEOL region of the semiconductor device 200, one or more operations to form a portion of a dielectric layer 222 in the BEOL region of the semiconductor device 200, and/or one or more other operations.

As shown in FIG. 4B, the semiconductor device 200 may be positioned in a first processing chamber 116 of a deposition tool 102 in preparation for one or more deposition operations. The wafer/die transport tool 114 of the deposition tool 102 may transfer the semiconductor device 200 to the first processing chamber 116 from another processing chamber (e.g., a third processing chamber 120) and/or from a FOUP or another type of wafer carrier.

As shown in FIG. 4C, the first conductive layer 262 may be formed over and/or on the portion of the dielectric layer 222. The deposition tool 102 may deposit the first conductive layer 262 in a CVD operation, a PVD operation, an ALD operation, another deposition operation described above in connection with FIG. 1, and/or another suitable deposition operation. The deposition tool 102 may perform the deposition operation in the first processing chamber 116. In some implementations, the planarization tool 110 planarizes the first conductive layer 262 after the deposition tool 102 deposits the first conductive layer 262.

As shown in FIG. 4D, the semiconductor device 200 may be transferred from the first processing chamber 116 to a second processing chamber 118. In some implementations, the wafer/die transport tool 114 may transfer the semiconductor device 200 from the first processing chamber 116 to the second processing chamber 118 "in-situ" (e.g., without breaking a vacuum in which the semiconductor device 200 is located). This may reduce the likelihood of exposure of the semiconductor device 200 to humidity and/or another type of contaminant.

As shown in FIG. 4E, a surface treatment operation may be performed on the first conductive layer 262 using a surface treatment chemical 402. The surface treatment chemical 402 may include nitrous oxide ($N_2O$) and/or another type of surface treatment chemical 402 that reacts with the material of the first conductive layer 262. The deposition tool 102 may perform the surface treatment operation using the surface treatment chemical 402 in the second processing chamber 118.

The deposition tool 102 may perform the surface treatment operation to form the buffer layer 302a in and/or on the first conductive layer 262. In particular, the nitrous oxide ($N_2O$) of the surface treatment chemical 402 may react with the titanium nitride (e.g., $Ti_xN$ such as $Ti_2N$) in the first conductive layer 262 to form the titanium oxide (e.g., $TiO_x$ such as $TiO_2$) in the buffer layer 302a and the titanium nitride (TiN) in the buffer layer 302a. The reaction between the material of the first conductive layer 262 and the nitrous oxide ($N_2O$) of the surface treatment chemical 402 may include:

$$Ti_2N + N_2O \rightarrow TiN + TiO_2$$

where the titanium nitride (e.g., $Ti_xN$ such as $Ti_2N$) in the first conductive layer 262 reacts with the nitrous oxide ($N_2O$) of the surface treatment chemical 402 to form the titanium oxide (e.g., $TiO_x$ such as $TiO_2$) in the buffer layer 302a and the titanium nitride (TiN) in the buffer layer 302a.

As shown in FIG. 4F, the insulator layer 264 is formed over and/or on the buffer layer 302a. The deposition tool 102 may deposit the insulator layer 264 in a PVD operation, an ALD operation, a CVD operation, an epitaxy operation, an oxidation operation, another type of deposition operation described in connection with FIG. 1, and/or another suitable deposition operation. In some implementations, the planarization tool 110 planarizes the insulator layer 264 after the deposition tool 102 deposits the insulator layer 264.

As shown in FIG. 4G, the semiconductor device 200 may be positioned in a first processing chamber 116 of a deposition tool 102 in preparation for one or more deposition operations. The wafer/die transport tool 114 of the deposition tool 102 may transfer the semiconductor device 200 to the first processing chamber 116 from another processing chamber (e.g., a second processing chamber 118, a third processing chamber 120).

As shown in FIG. 4H, a base layer 404 may be formed over and/or on the insulator layer 264. The base layer 404 may include the same material that is to be included in the second conductive layer 266 that is to be subsequently formed for the capacitor structure 260. For example, the base layer 404 may include a nitrogen-containing material or a nitride-containing material such as a titanium nitride ($Ti_xN$ such as $Ti_2N$). The deposition tool 102 may deposit the base layer 404 in a CVD operation, a PVD operation, an ALD operation, another deposition operation described above in connection with FIG. 1, and/or another suitable deposition operation. The deposition tool 102 may perform the deposition operation in the first processing chamber 116. In some implementations, the planarization tool 110 planarizes the base layer 404 after the deposition tool 102 deposits the base layer 404.

As shown in FIG. 4I, the semiconductor device 200 may be transferred from the first processing chamber 116 to a second processing chamber 118 after the base layer 404 is formed. In some implementations, the wafer/die transport tool 114 may transfer the semiconductor device 200 from the first processing chamber 116 to the second processing chamber 118 "in-situ" (e.g., without breaking a vacuum in which the semiconductor device 200 is located). This may reduce the likelihood of exposure of the semiconductor device 200 to humidity and/or another type of contaminant.

As shown in FIG. 4J, a surface treatment operation may be performed on the base layer 404 using a surface treatment chemical 406. The surface treatment chemical 406 may include nitrous oxide ($N_2O$) and/or another type of surface treatment chemical 406 that reacts with the material of the base layer 404. The deposition tool 102 may perform the surface treatment operation using the surface treatment chemical 406 in the second processing chamber 118.

The deposition tool 102 may perform the surface treatment operation to form the buffer layer 302b in the base layer 404 and/or on the insulator layer 264. In particular, the nitrous oxide ($N_2O$) of the surface treatment chemical 406 may react with the titanium nitride (e.g., $Ti_xN$ such as $Ti_2N$) in the base layer 404 to form the titanium oxide (e.g., $TiO_x$ such as $TiO_2$) in the buffer layer 302b and the titanium nitride (TiN) in the buffer layer 302b. The reaction between the material of the base layer 404 and the nitrous oxide ($N_2O$) of the surface treatment chemical 406 may include:

$$Ti_2N + N_2O \rightarrow TiN + TiO_2$$

where the titanium nitride (e.g., $Ti_xN$ such as $Ti_2N$) in the base layer 404 reacts with the nitrous oxide ($N_2O$) of the surface treatment chemical 406 to form the titanium oxide (e.g., $TiO_x$ such as $TiO_2$) in the buffer layer 302b and the titanium nitride (TiN) in the buffer layer 302b.

As shown in FIG. 4K, the semiconductor device 200 may be transferred from the second processing chamber 118 to a first processing chamber 116 after the buffer layer 302b is formed. In some implementations, the wafer/die transport tool 114 may transfer the semiconductor device 200 from the second processing chamber 118 to the first processing chamber 116 "in-situ" (e.g., without breaking a vacuum in which the semiconductor device 200 is located). This may reduce the likelihood of exposure of the semiconductor device 200 to humidity and/or another type of contaminant.

As shown in FIG. 4L, the second conductive layer 266 may be formed over and/or on the buffer layer 302b. The deposition tool 102 may deposit the second conductive layer 266 in a CVD operation, a PVD operation, an ALD operation, another deposition operation described above in connection with FIG. 1, and/or another suitable deposition operation. The deposition tool 102 may perform the deposition operation in the first processing chamber 116. In some implementations, the planarization tool 110 planarizes the second conductive layer 266 after the deposition tool 102 deposits the second conductive layer 266.

As shown in FIG. 4M, the capping layer 276 is formed over and/or on the second conductive layer 266. The deposition tool 102 may deposit the capping layer 276 in a PVD operation, an ALD operation, a CVD operation, an epitaxy operation, an oxidation operation, another type of deposition operation described in connection with FIG. 1, and/or another suitable deposition operation. In some implementations, the planarization tool 110 planarizes the capping layer 276 after the deposition tool 102 deposits the capping layer 276.

As shown in FIG. 4N, a photoresist layer 408 is formed over and/or on a portion of the capping layer 276. A pattern in a photoresist layer 408 may be used to etch the capping layer 276, the second conductive layer 266, and the buffer layer 302b such that a bottom metal contact 268 may be formed to the first conductive layer 262. The deposition tool 102 may form the photoresist layer 408 on the capping layer 276. The exposure tool 104 may expose the photoresist layer 408 to a radiation source to pattern the photoresist layer 408. The developer tool 106 develops and removes portions of the photoresist layer 408 to expose the pattern.

As shown in FIG. 4O, the etch tool 108 etches the capping layer 276, the second conductive layer 266, and the buffer layer 302b based on the pattern in the photoresist layer 408. In some implementations, the etch operation includes a plasma etch operation, a wet chemical etch operation, and/or another type of etch operation. In some implementations, a photoresist removal tool removes the remaining portions of the photoresist layer (e.g., using a chemical stripper, plasma ashing, and/or another technique). In some implementations, the etch tool 108 etches the capping layer 276 based on the pattern in the photoresist layer 408 to transfer the pattern in the capping layer 276, and the etch tool 108 uses the pattern in the capping layer 276 as a hard mask to etch the second conductive layer 266 and/or the buffer layer 302b. In some implementations, a photoresist removal tool removes the remaining portions of the photoresist layer 408 (e.g., using a chemical stripper, plasma ashing, and/or another technique).

As shown in FIG. 4P, the capping layer 278 and the capping layer 280 may be formed over and/or on the exposed portions of the insulator layer 264, over and/or on the top surface of the capping layer 276, and/or on the sidewalls of the buffer layer 302b, the second conductive layer 266, and/or the capping layer 276. The capping layers 278 and 280 may electrically isolate the capacitor structure 260 from other layers and/or structures in the semiconductor device 200. The deposition tool 102 may conformally deposit the capping layer 278 and the capping layer 280 in a PVD operation, an ALD operation, a CVD operation, an epitaxy operation, an oxidation operation, another type of deposition operation described in connection with FIG. 1, and/or another suitable deposition operation.

As shown in FIG. 4Q, a photoresist layer 410 is formed over and/or on a portion of the capping layer 280. A pattern in a photoresist layer 408 may be used to etch the capping layer 280, the capping layer 278, the insulator layer 264, the buffer layer 302a, and the first conductive layer 262 to define the first conductive layer 262. The deposition tool 102 may form the photoresist layer 410 on the capping layer 280. The exposure tool 104 may expose the photoresist layer 410 to a radiation source to pattern the photoresist layer 410. The developer tool 106 develops and removes portions of the photoresist layer 410 to expose the pattern.

As shown in FIG. 4R, the etch tool 108 etches the capping layer 280, the capping layer 278, the insulator layer 264, the buffer layer 302a, and the first conductive layer 262 based on the pattern in the photoresist layer 410 to define the first conductive layer 262. In some implementations, the etch operation includes a plasma etch operation, a wet chemical etch operation, and/or another type of etch operation. In some implementations, a photoresist removal tool removes the remaining portions of the photoresist layer (e.g., using a chemical stripper, plasma ashing, and/or another technique).

In some implementations, a photoresist removal tool removes the remaining portions of the photoresist layer 410 (e.g., using a chemical stripper, plasma ashing, and/or another technique).

As shown in FIG. 4S, an additional portion of the dielectric layer 222 may be formed such that the dielectric layer 222 encapsulates the capacitor structure 260. The deposition tool 102 may deposit the additional portion of the dielectric layer 222 in a PVD operation, an ALD operation, a CVD operation, an epitaxy operation, an oxidation operation, another type of deposition operation described in connection with FIG. 1, and/or another suitable deposition operation. In some implementations, the planarization tool 110 planarizes the dielectric layer 222 after the deposition tool 102 deposits the additional portion of the dielectric layer 222.

As shown in FIG. 4T, a recess 412 is formed through the dielectric layer 222, through the capping layer 280, through the capping layer 278, through the insulator layer 264, through the buffer layer 302a, and to the first conductive layer 262. The first conductive layer 262 is exposed through the recess 412.

In some implementations, a pattern in a photoresist layer is used to etch the dielectric layer 222, the capping layer 280, the capping layer 278, the insulator layer 264, and the buffer layer 302a to form the recess 412. In these implementations, the deposition tool 102 forms the photoresist layer over and/or on the dielectric layer 222. The exposure tool 104 exposes the photoresist layer to a radiation source to pattern the photoresist layer. The developer tool 106 develops and removes portions of the photoresist layer to expose the pattern. The etch tool 108 etches through the dielectric layer 222, through the capping layer 280, through the capping layer 278, through the insulator layer 264, through the buffer layer 302a based on the pattern to form the recess 412. In some implementations, the etch operation includes a plasma etch operation, a wet chemical etch operation, and/or another type of etch operation. In some implementations, a photoresist removal tool removes the remaining portions of the photoresist layer (e.g., using a chemical stripper, plasma ashing, and/or another technique). In some implementations, a hard mask layer is used as an alternative technique for etching the recess 412 based on a pattern. In some implementations, a photoresist removal tool removes the remaining portions of the photoresist layer (e.g., using a chemical stripper, plasma ashing, and/or another technique).

As further shown in FIG. 4T, a recess 414 is formed through the dielectric layer 222, through the capping layer 280, through the capping layer 278, through the capping layer 276, and to the second conductive layer 266. The second conductive layer 266 is exposed through the recess 414.

In some implementations, a pattern in a photoresist layer is used to etch the dielectric layer 222, the capping layer 280, the capping layer 278, and the capping layer 276 to form the recess 414. In these implementations, the deposition tool 102 forms the photoresist layer over and/or on the dielectric layer 222. The exposure tool 104 exposes the photoresist layer to a radiation source to pattern the photoresist layer. The developer tool 106 develops and removes portions of the photoresist layer to expose the pattern. The etch tool 108 etches through the dielectric layer 222, through the capping layer 280, through the capping layer 278, and through the capping layer 276 based on the pattern to form the recess 414. In some implementations, the etch operation includes a plasma etch operation, a wet chemical etch operation, and/or another type of etch operation. In some implementations, a photoresist removal tool removes the remaining portions of the photoresist layer (e.g., using a chemical stripper, plasma ashing, and/or another technique). In some implementations, a hard mask layer is used as an alternative technique for etching the recess 414 based on a pattern. In some implementations, a photoresist removal tool removes the remaining portions of the photoresist layer (e.g., using a chemical stripper, plasma ashing, and/or another technique).

As shown in FIG. 4U, a bottom metal contact 268 is formed in the recess 412. The bottom metal contact 268 is formed on the first conductive layer 262 (e.g., such that the bottom metal contact 268 lands on the first conductive layer 262 in the recess 412). The deposition tool 102 and/or the plating tool 112 may deposit the bottom metal contact 268 in a CVD operation, a PVD operation, an ALD operation, an electroplating operation, another deposition operation described above in connection with FIG. 1, and/or another suitable deposition operation. In some implementations, a seed layer is first deposited, and the bottom metal contact 268 is deposited on the seed layer. In some implementations, the planarization tool 110 planarizes the bottom metal contact 268 after the deposition tool 102 and/or the plating tool 112 deposits the bottom metal contact 268.

As further shown in FIG. 4U, a top metal contact 270 is formed in the recess 414. The top metal contact 270 is formed on the second conductive layer 266 (e.g., such that the top metal contact 270 lands on the second conductive layer 266 in the recess 414). The deposition tool 102 and/or the plating tool 112 may deposit the top metal contact 270 in a CVD operation, a PVD operation, an ALD operation, an electroplating operation, another deposition operation described above in connection with FIG. 1, and/or another suitable deposition operation. In some implementations, a seed layer is first deposited, and the top metal contact 270 is deposited on the seed layer. In some implementations, the planarization tool 110 planarizes the top metal contact 270 after the deposition tool 102 and/or the plating tool 112 deposits the top metal contact 270.

As indicated above, FIGS. 4A-4U are provided as an example. Other examples may differ from what is described with regard to FIGS. 4A-4U.

Figure 5:
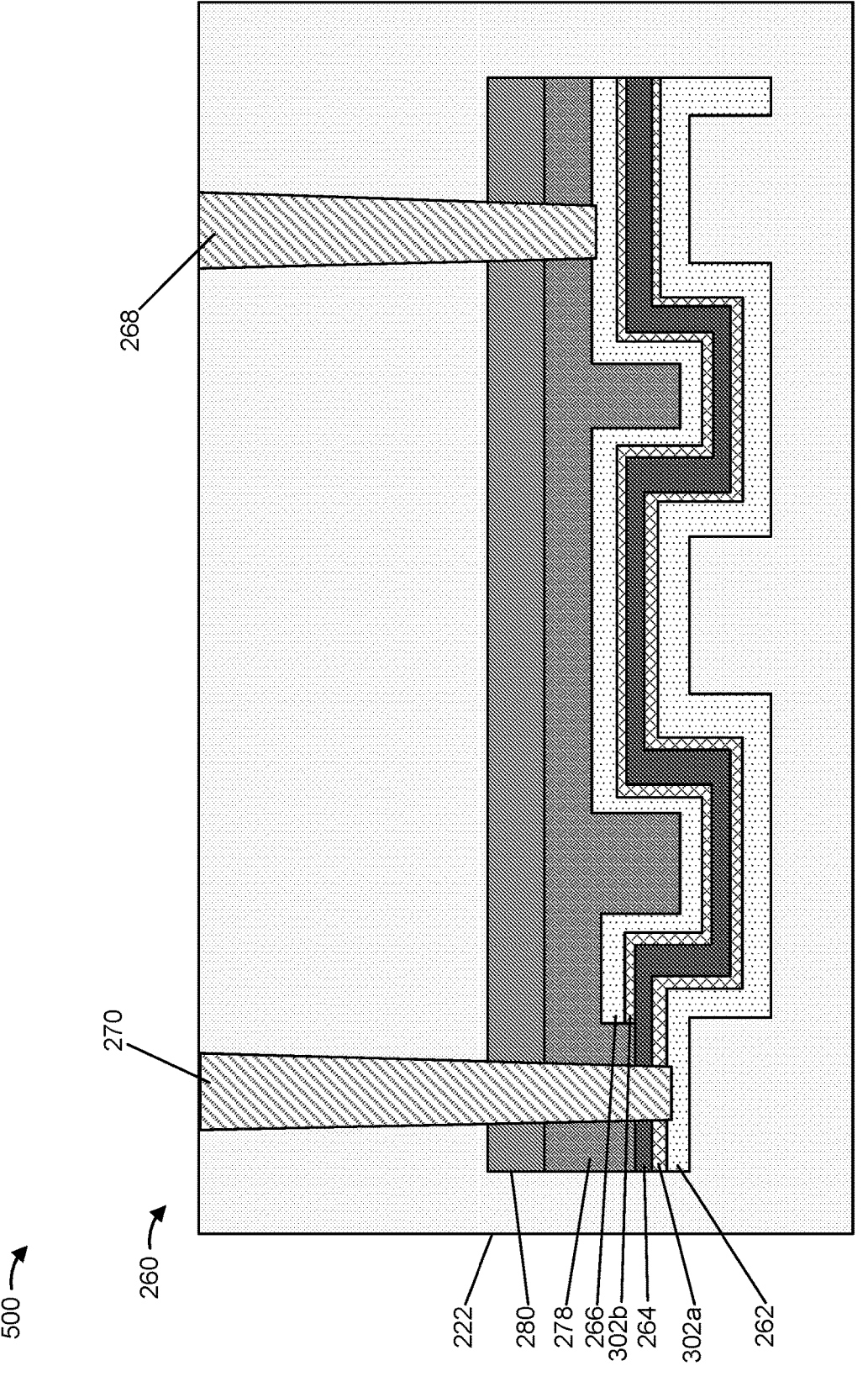
FIG. 5 is a diagram of an example implementation of a capacitor structure described herein.

FIG. 5 is a diagram of an example implementation 500 of a capacitor structure 260 described herein. As shown in FIG. 5, the example implementation 500 of the capacitor structure 260 may include a similar configuration of layers and/or structures as the example implementation 300 of a capacitor structure 260 in FIGS. 3A-3C. However, the example implementation 500 of the capacitor structure 260 includes a non-planar capacitor structure (e.g., non-planar MTM structure), whereas the example implementation 300 of a capacitor structure 260 in FIGS. 3A-3C is illustrated as including an approximately planar capacitor structure (e.g., a planar MTM structure).

As shown in FIG. 5, the example implementation 500 of the capacitor structure 260 may include a first conductive layer 262, a buffer layer 302a over and/or on the first conductive layer 262, an insulator layer 264 over and/or on the buffer layer 302a, a buffer layer 302b over and/or on the insulator layer 264, a second conductive layer 266 over and/or on the buffer layer 302b, a bottom metal contact 268, a top metal contact 270, and capping layers 278 and 280. While the capping layer 276 is shown as being omitted from the example implementation 500 of the capacitor structure 260, the example implementation 500 of the capacitor structure 260 may alternatively include the capping layer 276.

As further shown in FIG. 5, the first conductive layer 262, the buffer layer 302a, the insulator layer 264, the buffer layer 302*b*, and the second conductive layer 266 are non-planar. As an example, the buffer layer 302*a*, the insulator layer 264, the buffer layer 302*b*, and the second conductive layer 266 may conform to one or more trench shapes, as shown in the example implementation 500 in FIG. 5. The trench shapes increase the surface area of the first conductive layer 262 and the second conductive layer 266, which may increase the capacitance of the capacitor structure 260. In some implementations, the buffer layer 302*a*, the insulator layer 264, the buffer layer 302*b*, and the second conductive layer 266 are non-planar may conform to other shapes and/or profiles, such as a deep trench capacitor (DTC) profile, a fin-shaped capacitor profile, and/or another type of capacitor profile.

As indicated above, FIG. 5 is provided as an example. Other examples may differ from what is described with regard to FIG. 5.

Figure 6:
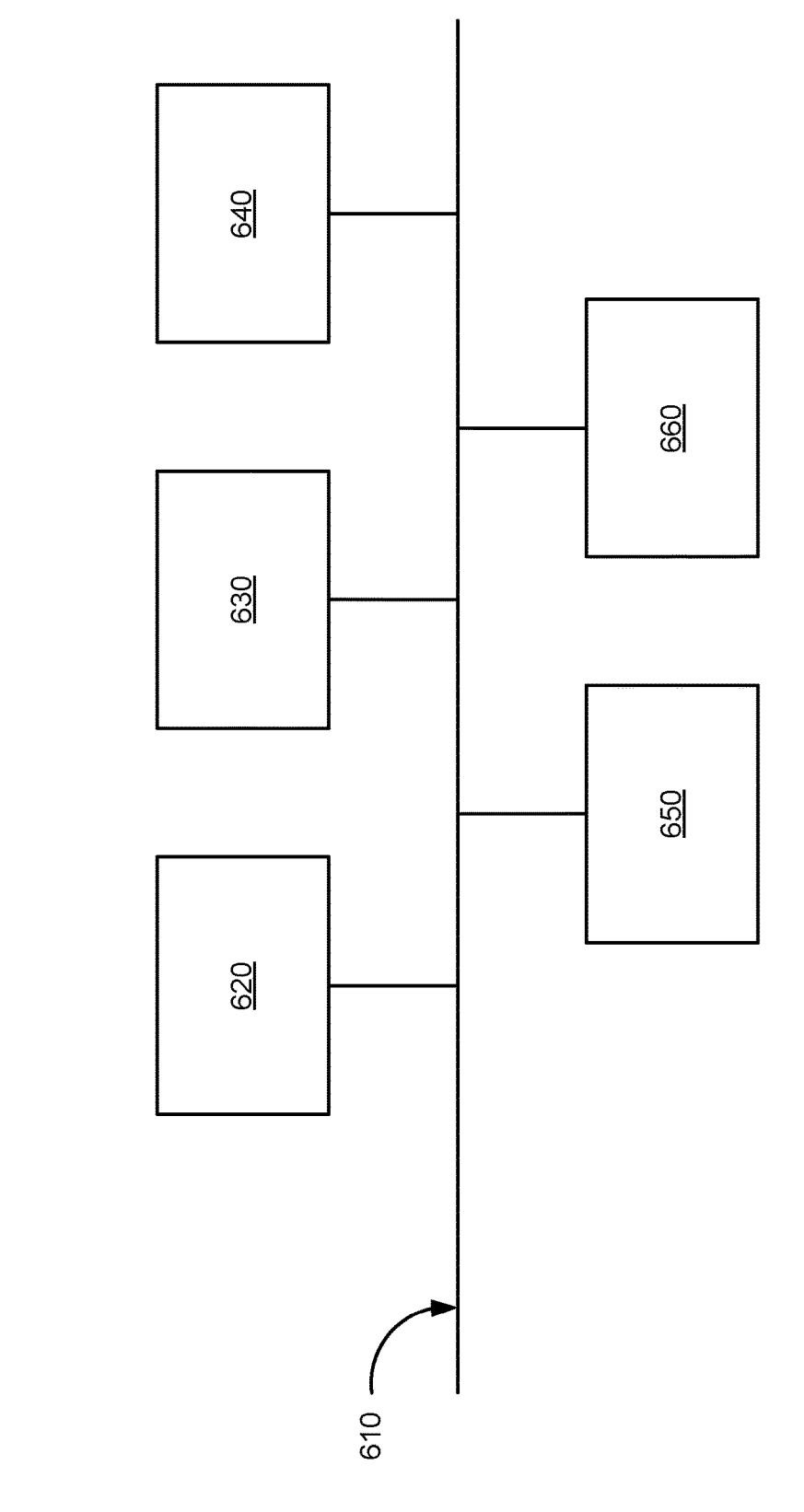
FIG. 6 is a diagram of example components of a device described herein.

FIG. 6 is a diagram of example components of a device 600 described herein. In some implementations, one or more of the semiconductor processing tools and/or a wafer/die transport tool 114 may include one or more devices 600 and/or one or more components of the device 600. As shown in FIG. 6, the device 600 may include a bus 610, a processor 620, a memory 630, an input component 640, an output component 650, and/or a communication component 660.

The bus 610 may include one or more components that enable wired and/or wireless communication among the components of the device 600. The bus 610 may couple together two or more components of FIG. 6, such as via operative coupling, communicative coupling, electronic coupling, and/or electric coupling. For example, the bus 610 may include an electrical connection (e.g., a wire, a trace, and/or a lead) and/or a wireless bus. The processor 620 may include a central processing unit, a graphics processing unit, a microprocessor, a controller, a microcontroller, a digital signal processor, a field-programmable gate array, an application-specific integrated circuit, and/or another type of processing component. The processor 620 may be implemented in hardware, firmware, or a combination of hardware and software. In some implementations, the processor 620 may include one or more processors capable of being programmed to perform one or more operations or processes described elsewhere herein.

The memory 630 may include volatile and/or nonvolatile memory. For example, the memory 630 may include random access memory (RAM), read only memory (ROM), a hard disk drive, and/or another type of memory (e.g., a flash memory, a magnetic memory, and/or an optical memory). The memory 630 may include internal memory (e.g., RAM, ROM, or a hard disk drive) and/or removable memory (e.g., removable via a universal serial bus connection). The memory 630 may be a non-transitory computer-readable medium. The memory 630 may store information, one or more instructions, and/or software (e.g., one or more software applications) related to the operation of the device 600. In some implementations, the memory 630 may include one or more memories that are coupled (e.g., communicatively coupled) to one or more processors (e.g., processor 620), such as via the bus 610. Communicative coupling between a processor 620 and a memory 630 may enable the processor 620 to read and/or process information stored in the memory 630 and/or to store information in the memory 630.

The input component 640 may enable the device 600 to receive input, such as user input and/or sensed input. For example, the input component 640 may include a touch screen, a keyboard, a keypad, a mouse, a button, a microphone, a switch, a sensor, a global positioning system sensor, a global navigation satellite system sensor, an accelerometer, a gyroscope, and/or an actuator. The output component 650 may enable the device 600 to provide output, such as via a display, a speaker, and/or a light-emitting diode. The communication component 660 may enable the device 600 to communicate with other devices via a wired connection and/or a wireless connection. For example, the communication component 660 may include a receiver, a transmitter, a transceiver, a modem, a network interface card, and/or an antenna.

The device 600 may perform one or more operations or processes described herein. For example, a non-transitory computer-readable medium (e.g., memory 630) may store a set of instructions (e.g., one or more instructions or code) for execution by the processor 620. The processor 620 may execute the set of instructions to perform one or more operations or processes described herein. In some implementations, execution of the set of instructions, by one or more processors 620, causes the one or more processors 620 and/or the device 600 to perform one or more operations or processes described herein. In some implementations, hard-wired circuitry may be used instead of or in combination with the instructions to perform one or more operations or processes described herein. Additionally, or alternatively, the processor 620 may be configured to perform one or more operations or processes described herein. Thus, implementations described herein are not limited to any specific combination of hardware circuitry and software.

The number and arrangement of components shown in FIG. 6 are provided as an example. The device 600 may include additional components, fewer components, different components, or differently arranged components than those shown in FIG. 6. Additionally, or alternatively, a set of components (e.g., one or more components) of the device 600 may perform one or more functions described as being performed by another set of components of the device 600.

FIG. 7 is a flowchart of an example process 700 associated with forming a capacitor structure including a buffer layer. In some implementations, one or more process blocks of FIG. 7 are performed by one or more semiconductor processing tools (e.g., one or more of the semiconductor processing tools 102-114). Additionally, or alternatively, one or more process blocks of FIG. 7 may be performed by one or more components of device 600, such as processor 620, memory 630, input component 640, output component 650, and/or communication component 660.

As shown in FIG. 7, process 700 may include forming a first conductive layer of a capacitor structure in a semiconductor device (block 710). For example, one or more of the semiconductor processing tools 102-114 may form a first conductive layer 262 of a capacitor structure 260 in a semiconductor device 200, as described herein.

As further shown in FIG. 7, process 700 may include forming, over the first conductive layer, an insulator layer of the capacitor structure (block 720). For example, one or more of the semiconductor processing tools 102-114 may form, over the first conductive layer 262, an insulator layer 264 of the capacitor structure 260, as described herein.

As further shown in FIG. 7, process 700 may include forming a base layer on the insulator layer (block 730). For example, one or more of the semiconductor processing tools 102-114 may form a base layer 404 on the insulator layer 264, as described herein.

As further shown in FIG. 7, process 700 may include performing, using nitrous oxide ($N_2O$), a surface treatment operation on the base layer to transform the base layer into a buffer layer on the insulator layer (block 740). For example, one or more of the semiconductor processing tools 102-114 may perform, using nitrous oxide ($N_2O$), a surface treatment operation on the base layer 404 to transform the base layer 404 into a buffer layer 302*b* on the insulator layer 264, as described herein.

As further shown in FIG. 7, process 700 may include forming, on the buffer layer, a second conductive layer of the capacitor structure (block 750). For example, one or more of the semiconductor processing tools 102-114 may form, on the buffer layer 302*b*, a second conductive layer 266 of the capacitor structure 260, as described herein.

Process 700 may include additional implementations, such as any single implementation or any combination of implementations described below and/or in connection with one or more other processes described elsewhere herein.

In a first implementation, forming the base layer 404 includes forming the base layer 404 in a first processing chamber 116 of a deposition tool 102, where performing the surface treatment operation includes performing the surface treatment operation in a second processing chamber 118 of the deposition tool 102.

In a second implementation, alone or in combination with the first implementation, process 700 includes transferring, using a wafer/die transport tool 114 of the deposition tool 102, the semiconductor device 200 from the first processing chamber 116 to the second processing chamber 118 without breaking a vacuum in which the semiconductor device 200 is located.

In a third implementation, alone or in combination with one or more of the first and second implementations, process 700 includes performing, using nitrous oxide ($N_2O$), another surface treatment operation on the first conductive layer 262 to form another buffer layer 302*a* on the first conductive layer 262.

In a fourth implementation, alone or in combination with one or more of the first through third implementations, forming the insulator layer 264 includes forming the insulator layer 264 on the other buffer layer 302*a*.

Although FIG. 7 shows example blocks of process 700, in some implementations, process 700 includes additional blocks, fewer blocks, different blocks, or differently arranged blocks than those depicted in FIG. 7. Additionally, or alternatively, two or more of the blocks of process 700 may be performed in parallel.

In this way, a buffer layer may be included between a first conductive electrode layer and an insulator layer, and/or between a second conductive electrode layer and the insulator layer of a capacitor structure to reduce lattice mismatching in the capacitor structure. The buffer layer(s) include a combination of materials that promote lattice matching between the insulator layer and one or more of the conductive electrode layers. This reduces the likelihood of formation of structural defects in the capacitor structure relative to another capacitor structure that does not include the buffer layer(s). This may increase performance for the capacitor structure and/or reduce the likelihood of failure of the capacitor structure. Moreover, this may reduce the defect rate in a semiconductor device that includes capacitor structures having the buffer layer(s), may reduce the likelihood of failure of the semiconductor device, and/or may increase the yield of semiconductor devices that include capacitor structures having the buffer layer(s), among other examples.

Some implementations described herein provide a semiconductor device. The semiconductor device includes a dielectric layer. The semiconductor device includes a capacitor structure included in the dielectric layer, where the capacitor structure includes a first conductive layer an insulator layer over the first conductive layer, a second conductive layer over the insulator layer, and a buffer layer between the insulator layer and at least one of the first conductive layer or the second conductive layer.

Some implementations described herein provide a method. The method includes forming a first conductive layer of a capacitor structure in a semiconductor device. The method includes forming, over the first conductive layer, an insulator layer of the capacitor structure. The method includes forming a base layer on the insulator layer. The method includes performing, using nitrous oxide ($N_2O$), a surface treatment operation on the base layer to transform the base layer into a buffer layer on the insulator layer. The method includes forming, on the buffer layer, a second conductive layer of the capacitor structure.

Some implementations described herein provide a semiconductor device. The semiconductor device includes a dielectric layer. The semiconductor device includes a capacitor structure included in the dielectric layer, where the capacitor structure includes a first conductive layer, an insulator layer, over the first conductive layer, a first buffer layer between the insulator layer and the first conductive layer, a second conductive layer over the insulator layer, and a second buffer layer between the insulator layer and the second conductive layer, where the first buffer layer and the second buffer layer each include a nitrogen-containing material and an oxygen-containing material.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method, comprising:
  forming a first conductive layer of a capacitor structure in a semiconductor device;
  forming, over the first conductive layer, an insulator layer of the capacitor structure;
  forming a base layer on the insulator layer;
  performing, using nitrous oxide ($N_2O$), a surface treatment operation on the base layer to transform the base layer into a buffer layer on the insulator layer; and
  forming, on the buffer layer, a second conductive layer of the capacitor structure,
  wherein an atomic percentage of nitrogen in the buffer layer is greater than an atomic percentage of nitrogen in least one of the first conductive layer or the second conductive layer.

2. The method of claim 1,
  wherein forming the base layer comprises:
    forming the base layer in a first processing chamber of a deposition tool; and
  wherein performing the surface treatment operation comprises:
    performing the surface treatment operation in a second processing chamber of the deposition tool.

3. The method of claim 2, further comprising:
  transferring, using a wafer/die transport tool of the deposition tool, the semiconductor device from the first processing chamber to the second processing chamber without breaking a vacuum in which the semiconductor device is located.

4. The method of claim 1, further comprising:

performing, using nitrous oxide (N₂O), another surface treatment operation on the first conductive layer to form another buffer layer on the first conductive layer.

5. The method of claim 4, wherein forming the insulator layer comprises:

forming the insulator layer on the other buffer layer.

6. A method, comprising:

forming a first conductive layer of a capacitor structure in a semiconductor device;

forming, over the first conductive layer, an insulator layer of the capacitor structure;

forming a base layer on the insulator layer;

performing, using nitrous oxide (N₂O), a surface treatment operation on the base layer to transform the base layer into a buffer layer on the insulator layer; and forming, on the buffer layer, a second conductive layer of the capacitor structure, wherein a concentration of oxygen in the insulator layer is greater than a concentration of oxygen in the buffer layer.

7. The method of claim 6, wherein the concentration of oxygen in the buffer layer changes between a top surface of the buffer layer and a bottom surface of the buffer layer.

8. The method of claim 6, wherein a thickness of the buffer layer is less than a thickness of at least one of the first conductive layer or the second conductive layer.

9. The method of claim 6, wherein a concentration of a nitrogen-containing material in the buffer layer is greater than a concentration of an oxygen-containing material in the buffer layer.

10. The method of claim 6, wherein a concentration of nitrogen in the buffer layer is greater than a concentration of nitrogen in the first conductive layer.

11. The method of claim 6, wherein a concentration of titanium in the buffer layer, and a concentration of titanium in the first conductive layer, are approximately a same concentration of titanium.

12. The method of claim 6, wherein the concentration of oxygen in the buffer layer is greater than a concentration of oxygen in the first conductive layer.

13. The method of claim 6, wherein the buffer layer and the insulator layer have approximately a same (001) lattice structure.

14. A method, comprising:

forming a first conductive layer of a capacitor structure in a semiconductor device;

forming, over the first conductive layer, an insulator layer of the capacitor structure;

forming a base layer on the insulator layer;

performing, using nitrous oxide (N₂O), a surface treatment operation on the base layer to transform the base layer into a buffer layer on the insulator layer; and forming, on the buffer layer, a second conductive layer of the capacitor structure, wherein an oxygen concentration in the buffer layer changes between a top surface of the buffer layer and a bottom surface of the buffer layer.

15. The method of claim 14, wherein an atomic percentage of nitrogen in the buffer layer is greater relative to an atomic percentage of nitrogen in the least one of the first conductive layer or the second conductive layer.

16. The method of claim 14, wherein the insulator layer comprises a hafnium oxide (HfO$_x$) containing material; and wherein the buffer layer comprises a titanium oxide (TiO$_x$) containing material.

17. The method of claim 14, wherein the at least one of the first conductive layer or the second conductive layer comprises a titanium nitride (Ti$_x$N) containing material; and wherein the buffer layer comprises a titanium oxide (Ti$_x$N) containing material.

18. The method of claim 14, wherein a thickness of the buffer layer is less than a thickness of the at least one of the first conductive layer or the second conductive layer.

19. The method of claim 14, wherein an oxygen-containing material of the buffer layer, and the first conductive layer, have approximately a same (001) lattice structure.

20. The method of claim 14, wherein a concentration of oxygen in the buffer layer is greater than a concentration of oxygen in the first conductive layer; and wherein a concentration of oxygen in the insulator layer is greater than a concentration of oxygen in the buffer layer.

* * * * *